US012666946B2

(12) United States Patent
Kim et al.

(10) Patent No.: US 12,666,946 B2
(45) Date of Patent: Jun. 23, 2026

(54) SEMICONDUCTOR DEVICE

(71) Applicant: SAMSUNG ELECTRONICS CO., LTD., Suwon-si (KR)

(72) Inventors: Hyungjune Kim, Suwon-si (KR); Byungyun Kang, Suwon-si (KR); Donghyun Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 361 days.

(21) Appl. No.: 18/352,552

(22) Filed: Jul. 14, 2023

(65) Prior Publication Data

US 2024/0213146 A1 Jun. 27, 2024

(30) Foreign Application Priority Data

Dec. 22, 2022 (KR) ........................ 10-2022-0182091

(51) Int. Cl.
*H10W 20/42* (2026.01)
*H10W 20/43* (2026.01)
*H10D 84/85* (2025.01)

(52) U.S. Cl.
CPC ........... *H10W 20/42* (2026.01); *H10W 20/43* (2026.01); *H10D 84/853* (2025.01); *H10D 84/859* (2025.01)

(58) Field of Classification Search
CPC ............... H01L 23/5226; H01L 23/528; H01L 23/5286; H01L 23/522; H01L 23/481; H01L 23/5283; H10D 84/853; H10D 84/859; H10D 30/43; H10D 62/121; H10D 84/0186; H10D 84/0193; H10D 84/038; H10D 84/85; B82Y 10/00; H10W 20/42;

(Continued)

(56) References Cited

U.S. PATENT DOCUMENTS 8,269,350 B1 9/2012 Chen et al.
8,816,407 B2 8/2014 Kim et al.
(Continued)

FOREIGN PATENT DOCUMENTS

KR 10-2014-0020507 2/2014
KR 10-2344320 12/2021
(Continued)

*Primary Examiner* — Patricia D Valenzuela
(74) *Attorney, Agent, or Firm* — MORGAN, LEWIS & BOCKIUS LLP

(57) ABSTRACT

A semiconductor device according to the disclosure includes: a substrate including a first side and a second side opposite each other with a thickness therebetween, a first wire disposed on the first side of the substrate, a first dummy wire disposed on the first side of the substrate and spaced apart from the first wire, a second wire disposed on the second side of the substrate, a second dummy wire disposed on the second side of the substrate and spaced apart from the second wire, a through via passing through the substrate and connecting the first wire and the second wire, and a plurality of dummy through vias passing through the substrate, wherein the plurality of dummy through vias are laterally offset and physically separated from the first wire and the second wire, wherein a center of at least one of the plurality of dummy through vias is laterally offset from an edge of at least one of the first dummy wire and the second dummy wire.

20 Claims, 16 Drawing Sheets

(58) Field of Classification Search
CPC .............. H10W 20/43; H10W 20/212; H10W 20/2134; H10W 20/40; H10W 20/481; H10W 20/20; H10W 20/427; H10W 20/435
See application file for complete search history.

(56) References Cited

U.S. PATENT DOCUMENTS

| | | | |
|---|---|---|---|
| 9,318,442 B1 * | 4/2016 | Chen ................... H01L 23/5384 |
| 9,613,881 B2 | 4/2017 | Ahn et al. |
| 9,793,246 B1 | 10/2017 | Tseng et al. |
| 9,972,581 B1 | 5/2018 | Yu et al. |
| 10,020,290 B2 | 7/2018 | Choe et al. |
| 10,354,961 B2 | 7/2019 | Yu et al. |
| 10,923,420 B2 | 2/2021 | Oh et al. |
| 11,031,352 B2 | 6/2021 | Yu et al. |
| 2010/0171226 A1 | 7/2010 | West et al. |
| 2011/0049723 A1 * | 3/2011 | Fayaz ............... H01L 21/76801 |
| | | | 257/E21.59 |
| 2019/0051600 A1 | 2/2019 | Oh et al. |
| 2019/0148345 A1 | 5/2019 | Park |

FOREIGN PATENT DOCUMENTS

| | | |
|---|---|---|
| TW | 201743427 A | 12/2017 |
| TW | 201830639 A | 8/2018 |

* cited by examiner

FIG. 13

SEMICONDUCTOR DEVICE

CROSS-REFERENCE TO RELATED APPLICATION

This application claims priority under 35 USC § 119 to Korean Patent Application No. 10-2022-0182091 filed in the Korean Intellectual Property Office on Dec. 22, 2022, the entire contents of which is incorporated by reference herein.

BACKGROUND

1. Field

The disclosure relates to a semiconductor device.

2. Description of the Related Art

As a 3-dimensional (3D) package for mounting a plurality of semiconductor chips in one semiconductor package is actively developed, a method for forming a through silicon via structure for perpendicularly forming an electrical connection passing through a substrate or a die is also being actively developed. To increase performance and reliability of the 3D package, methods and devices for forming stable TSV structures are needed.

SUMMARY

The disclosure has been made in an effort to provide a semiconductor device for increasing product reliability by forming a plurality of dummy through vias passing through a substrate, on the substrate.

An embodiment of the disclosure provides a semiconductor device including: a substrate including a first side and a second side opposite each other with a thickness therebetween, a first wire disposed on the first side of the substrate, a first dummy wire disposed on the first side of the substrate and spaced apart from the first wire, a second wire disposed on the second side of the substrate, a second dummy wire disposed on the second side of the substrate and spaced apart from the second wire, a through via passing through the substrate and connecting the first wire and the second wire, and a plurality of dummy through vias passing through the substrate, wherein the plurality of dummy through vias are laterally offset and physically separated from the first wire and the second wire, wherein a center of at least one of the plurality of dummy through vias is laterally offset from an edge of at least one of the first dummy wire and the second dummy wire.

The dummy through vias may include a first dummy through via, and a center of the first dummy through via may overlap the first dummy wire and may be laterally offset from the second dummy wire.

The first dummy through via may overlap the first dummy wire and may be laterally offset from an edge of the second dummy wire.

The first dummy through via may completely overlap the first dummy wire and may partly overlap the second dummy wire.

The dummy through vias may include a second dummy through via, and a center of the second dummy through via may be laterally offset from an edge of the first dummy wire and may overlap the second dummy wire.

The second dummy through via may be laterally offset from an edge of the first dummy wire and may overlap the second dummy wire.

The second dummy through via may partly overlap the first dummy wire and may completely overlap the second dummy wire.

The dummy through vias may include a third dummy through via, and a center of the third dummy through via may be laterally offset from an edge of the first dummy wire and the second dummy wire.

The third dummy through via may partly overlap the first dummy wire and may be laterally offset from the second dummy wire.

The third dummy through via may partly overlap the first dummy wire and may partly overlap the second dummy wire.

The third dummy through via may be laterally offset from an edge of the first dummy wire and may partly overlap the second dummy wire.

The dummy through vias may include a fourth dummy through via, and a center of the fourth dummy through via may overlap the first dummy wire and the second dummy wire.

The dummy through vias may include a fifth dummy through via, and the fifth dummy through via may laterally offset and physically separated from the first dummy wire and the second dummy wire.

The dummy through vias may electrically float.

Another embodiment of the disclosure provides a semiconductor device including: a substrate including a first side and a second side opposite each other with a thickness therebetween, a first wire disposed on the first side of the substrate, a first dummy wire disposed on the first side of the substrate and spaced apart from the first wire, a second wire disposed on the second side of the substrate, a second dummy wire disposed on the second side of the substrate and spaced apart from the second wire, a through via passing through the substrate and connecting the first wire and the second wire, a plurality of dummy through vias passing through the substrate and not overlapping the first wire and the second wire, and an insulation layer disposed on at least one of the first side and the second side of the substrate, wherein a center of at least one of the plurality of dummy through vias does not overlap at least one of the first dummy wire and the second dummy wire, and at least one of the plurality of dummy through vias contacts the insulation layer.

The plurality of dummy through vias may include a first dummy through via, a second dummy through via, a third dummy through via, and a fourth dummy through via, a center of the first dummy through via may overlap the first dummy wire and may not overlap the second dummy wire, a center of the second dummy through via may not overlap the first dummy wire and may overlap the second dummy wire, a center of the third dummy through via may not overlap the first dummy wire and the second dummy wire, and a center of the fourth dummy through via may overlap the first dummy wire and the second dummy wire.

The first dummy through via may overlap part of the first dummy wire and may overlap part of the second dummy wire, and an area where the first dummy through via overlaps the first dummy wire may be different from an area where the first dummy through via overlaps the second dummy wire.

The first dummy through via may overlap part of the first dummy wire, the fourth dummy through via may overlap part of the first dummy wire, and an area where the first dummy through via overlaps the first dummy wire may be different from an area where the fourth dummy through via overlaps the second dummy wire.

Another embodiment of the disclosure provides a semiconductor device including: a substrate including a first side and a second side opposite each other with a thickness therebetween, a first wire disposed on the first side of the substrate, a first dummy wire disposed on the first side of the substrate and spaced apart from the first wire, a second wire disposed on the second side of the substrate, a second dummy wire disposed on the second side of the substrate and spaced apart from the second wire, a through via passing through the substrate and connecting the first wire and the second wire, and a plurality of dummy through vias passing through the substrate and laterally offset and physically separated from the first wire and the second wire, wherein the substrate may include a plurality of cell regions, and a sum of the number of the through vias and the number of the dummy through vias may be constant in the respective cell regions.

The dummy through vias may include a first dummy through via, a second dummy through via, a third dummy through via, and a fourth dummy through via, a center of the first dummy through via may overlap the first dummy wire and be laterally offset from an edge of the second dummy wire, a center of the second dummy through via may be laterally offset from a first edge of the first dummy wire and overlap the second dummy wire, a center of the third dummy through via may be laterally offset from a second edge of the first dummy wire and be laterally offset from an edge of the second dummy wire, and a center of the fourth dummy through via may overlap the first dummy wire and the second dummy wire.

According to the embodiments, as the dummy through vias passing through the substrate are formed on the substrate, the density of the through via and the dummy through via may be maintained in the respective regions of the substrate, and by this, the reliability-increased semiconductor device may be provided by performing the patterning process, the etching process, and the chemical mechanical polishing (CMP) process.

BRIEF DESCRIPTION OF THE DRAWINGS

FIG. 13 shows a layout diagram of a semiconductor device according to some embodiments.

DETAILED DESCRIPTION

Figure 1:
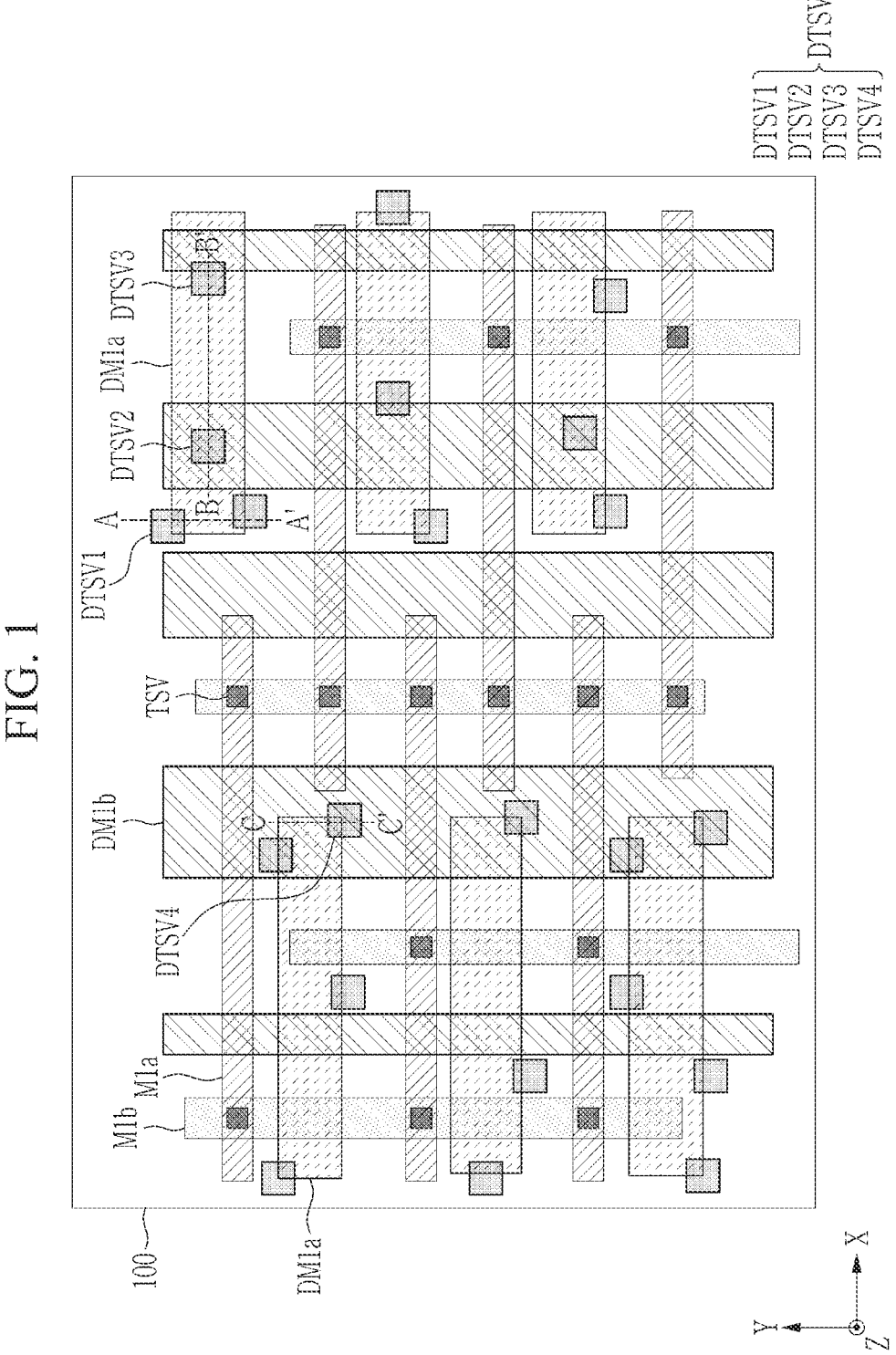
FIG. 1 shows a layout diagram of a semiconductor device according to an embodiment.

The disclosure will be described more fully hereinafter with reference to the accompanying drawings, in which embodiments of the disclosure are shown. As those skilled in the art would realize, the described embodiments may be modified in various different ways, all without departing from the spirit or scope of the disclosure.

Like reference numerals designate like elements throughout the specification and in the drawings. In the drawings, the thickness of layers, films, panels, regions, etc., are enlarged for clarity. For ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements. The word "on" or "above" means disposed on the object portion, and does not necessarily mean disposed "on" or "above" the upper side of the object portion based on a gravitational direction.

Unless explicitly described to the contrary, the word "comprise", and variations such as "comprises" or "comprising", will be understood to imply the inclusion of stated elements but not the exclusion of any other elements.

FIG. 1 shows a layout diagram of a semiconductor device according to an embodiment.

In detail, FIG. 1 shows a layout diagram of some of a plurality of cell regions provided on a substrate 100 included in a semiconductor device according to an embodiment. Depending on cases, FIG. 1 may show part of one cell region.

Referring to FIG. 1, the semiconductor device may include a substrate 100, and a plurality of first front wires M1$a$, first rear wires M1$b$, first front dummy wires DM1$a$, first rear dummy wires DM1$b$, through vias TSV, and dummy through vias DTSV, including DTSV1, DTSV2, DTSV3, DTSV4, disposed on the substrate 100.

The substrate 100 may be bulk silicon or a silicon-on-insulator (SOI). However, without being limited thereto, in some embodiments, the substrate 100 may be a silicon substrate, or may include other materials, for example, silicon germanium, a silicon germanium on insulator (SGOI), an indium antimonide, a lead telluride compound, indium arsenic, indium phosphide, gallium arsenic, or gallium antimonide.

The substrate 100 may include a first side and a second side opposite each other with a thickness therebetween. In various embodiments, the first side may be referred to as a front side of the substrate 100, and the second side may be referred to as a back side of the substrate 100. In some embodiments, a logic circuit of the cell region may be realized on a first side of the substrate 100.

The first front wires M1$a$ and the first front dummy wires DM1$a$ may be disposed on the first side of the substrate 100.

The first front wires M1$a$ may extend in a first direction (or an X direction) in parallel to an upper side of the substrate 100 and may be spaced apart from each other in a second direction (or a Y direction). The first front wires M1$a$ may extend in the first direction (or X direction), and may be alternately arranged to partly overlap each other in the second direction (or Y direction). The first front wires M1$a$ may be spaced apart and extend parallel to each other in the first direction (or X direction). However, the disposed form of the first front wires M1$a$ on the first side of the substrate 100 is not limited thereto and may be modifiable in many ways.

In some embodiments, the first front wires M1$a$ may include a first power supplying wire and a second power supplying wire. The first power supplying wire may provide a first power source voltage to the cell region, and the second power supplying wire may provide a second power source voltage to the cell region, where the second power source voltage can be different from the first power source voltage to the cell region. For example, the first power supplying wire may provide a drain voltage to the cell region, and the second power supplying wire may provide a source voltage to the cell region. The first power source voltage may be a positive (+) voltage, and the second power source voltage may be a ground (GND) voltage or a negative (−) voltage. However, the disclosure is not limited thereto. Detailed descriptions on the first power supplying wire POR1 and the second power supplying wire POR2 will be given later.

The first front dummy wires DM1a may extend in the first direction (or X direction) in parallel to the upper side of the substrate 100, and may be alternately arranged in the second direction (or Y direction). The first front dummy wires DM1a may be spaced apart and extend parallel to each other in the first direction (or X direction), where the first front dummy wires DM1a may be positioned between adjacent first front wires M1a.

Further, the first front dummy wires DM1a and the first front wires M1a may be alternately arranged in the second direction (or Y direction). Hence, the first front wires M1a may not overlap the first front dummy wires DM1a. In addition, the disposed form of the first front dummy wires DM1a on the first side of the substrate 100 is not limited thereto and may be modifiable in many ways.

The first rear wires M1b and the first rear dummy wires DM1b may be disposed on a second side of the substrate 100. The first rear wires M1b and the first rear dummy wires DM1b may be disposed on the back side of the substrate 100, where the substrate thickness can separate the front side first front wires M1a from the back side first rear wires M1b.

The first rear wires M1b may overlap the above-described first front wires M1a and the first front dummy wires DM1a. For example, the first rear wires M1b may extend in the second direction (or Y direction), and may be spaced apart from each other in the first direction (or X direction). The first rear wires M1b may also be arranged in a staggered way to partly overlap each other in the first direction (or X direction). In other words, the first rear wires M1b may be alternately arranged to partly overlap each other in the first direction (or X direction). The first rear wires M1b may be spaced apart and extend parallel to each other in the second direction (or Y direction).

In some embodiments, the first rear wires M1b may form a power delivery network (PDN) of the semiconductor device. For example, the first rear wires M1b may be connected to a pad of the semiconductor device according to some embodiments, may receive a power voltage from the outside, and may transmit the same. A detailed description thereof will be given later.

The first rear dummy wires DM1b may traverse the above-described first front wires M1a and the first front dummy wires DM1a. For example, the first rear dummy wires DM1b may extend in the second direction (or Y direction), and may be alternately arranged in the first direction (or X direction), where the first rear dummy wires DM1b may be perpendicular to the first front wires M1a and the first front dummy wires DM1a.

The first rear dummy wires DM1b and the first rear wires M1b may be alternately arranged in the first direction (or X direction). The first rear wires M1b may not overlap the first rear dummy wires DM1b, where the first rear wires M1b are laterally offset from the first rear dummy wires DM1b. However, the disposed form of the first rear wires M1b and the first rear dummy wires DM1b on the second side of the substrate 100 is not limited thereto and may be modifiable in many ways.

A plurality of through vias TSV and a plurality of dummy through vias DTSV passing through the substrate 100 may be disposed in the cell region provided on the substrate 100 included in the semiconductor device. The through vias TSV and dummy through vias DTSV can extend through the thickness of the substrate 110, where the through vias TSV and dummy through vias DTSV can traverse from a first side (or front side) to a second side (or back side).

The through vias TSV (also referred to as through silicon (or substrate) vias TSV) may be disposed in the region in which the first front wires M1a traverse the first rear wires M1b. The through vias TSV may pass through the substrate 100 and may connect the first front wires M1a and the first rear wires M1b. The through vias TSV may extend in the third direction (Z) of the substrate 100 and may electrically connect the first front wires M1a with the first rear wires M1b. A through vias TSV can have a top surface in contact with a first front wire M1a and a bottom surface in contact with a first rear wire M1b to form an electrical connection, where the through vias TSV at least partially overlaps the first front wire M1a and the first rear wire M1b. Accordingly, the first rear wires M1b forming the power delivery network (refer to PDN of FIG. 2 and FIG. 3) may supply the first power source voltage to the cell region.

The dummy through vias DTSV (also referred to as dummy through silicon (or substrate) vias TSV) may pass through the substrate 100, may overlap at least one of the first front dummy wire DM1a and the first rear dummy wire DM1b, and may be connected thereto. The dummy through vias DTSV may not overlap the first front wires M1a and the first rear wires M1b. The dummy through vias DTSV can be offset laterally from the first front wires M1a, the first rear wires M1b, or both, where a top surface of the dummy through via DTSV is physically separated from the first front wires M1a, and a bottom surface of the dummy through via DTSV is physically separated from the first rear wires M1b. The top surface of the dummy through via DTSV can be physically separated from the first front wires M1a by an electrically insulating material (e.g., interlayer insulating layer), and the bottom surface of the dummy through vias DTSV can be physically separated from the first rear wires M1b by an electrically insulating material (e.g., interlayer insulating layer), such that the dummy through vias DTSV does not electrically connect the first front wires M1a and first rear wires M1b. The dummy through vias DTSV may not overlap the through vias TSV, where the dummy through vias DTSV can be laterally offset and physically separated from the through vias TSV. In some embodiments, the dummy through vias DTSV may not overlap the first front dummy wires DM1a and the first rear dummy wires DM1b and may not be connected thereto, such that the dummy through vias DTSV does not connect the first front dummy wires DM1a and first rear dummy wires DM1b. The dummy through vias DTSV can be offset laterally from the first front dummy wires DM1a, the first rear dummy wires DM1b, or both, where a top surface of the dummy through via DTSV is offset and physically separated from the first front dummy wires DM1a, and a bottom surface of the dummy through via DTSV is offset and physically separated from the first rear dummy wires DM1b. The top surface of the dummy through via DTSV can be physically separated from the first front dummy wires DM1a by an electrically insulating material (e.g., interlayer insulating layer), and the bottom surface of the dummy through vias DTSV can be physically separated from the first rear dummy wires DM1$b$ by an electrically insulating material (e.g., interlayer insulating layer).

No voltage may be applied to the first front dummy wires DM1$a$ and the first rear dummy wires DM1$b$. Hence, the dummy through vias DTSV may electrically float.

As the through vias TSV do not overlap the first front dummy wires DM1$a$ and the first rear dummy wires DM1$b$, and are disposed in the region in which the first front wires M1$a$ traverse the first rear wires M1$b$, the through vias TSV may not overlap the dummy through vias DTSV. The through vias TSV can be offset laterally from the first front dummy wires DM1$a$, the first rear dummy wires DM1$b$, or both, where a top surface of the through via TSV is offset and physically separated from the first front dummy wires DM1$a$, and a bottom surface of the through via TSV is offset and physically separated from the first rear dummy wires DM1$b$. The top surface of the through via TSV can be physically separated from the first front dummy wires DM1$a$ by an electrically insulating material (e.g., interlayer insulating layer), and the bottom surface of the through vias TSV can be physically separated from the first rear dummy wires DM1$b$ by an electrically insulating material (e.g., interlayer insulating layer).

The dummy through vias DTSV may include first dummy through vias DTSV1, second dummy through vias DTSV2, third dummy through vias DTSV3, and fourth dummy through vias DTSV4 disposed in other areas in the cell region.

A center of the first dummy through vias DTSV1 may not overlap the first front dummy wires DM1$a$ and the first rear dummy wires DM1$b$, where the center of the first dummy through vias DTSV1 may be laterally offset from an edge of the first front dummy wires DM1$a$ and an edge of the first rear dummy wires DM1$b$. A portion of the top surface of the first dummy through via DTSV1 that is less than half the surface area may overlap with the first front dummy wire DM1$a$, and a portion of the bottom surface of the first dummy through via DTSV1 that is less than half the surface area may overlap with the first rear dummy wires DM1$b$.

A center of the second dummy through vias DTSV2 may overlap the first front dummy wires DM1$a$ and the first rear dummy wires DM1$b$.

A center of the third dummy through vias DTSV3 may overlap the first front dummy wires DM1$a$ and may not overlap the first rear dummy wires DM1$b$, where the center of the third dummy through vias DTSV3 may be laterally offset from an edge of the first rear dummy wires DM1$b$. A portion of the top surface of the third dummy through vias DTSV3 that is less than half the surface area may overlap with the first rear dummy wires DM1$b$.

A center of the fourth dummy through vias DTSV4 may not overlap the first front dummy wires DM1$a$ and may overlap the first rear dummy wires DM1$b$, where the center of the fourth dummy through vias DTSV4 may be laterally offset from an edge of the first front dummy wires DM1$a$. A portion of the top surface of the fourth dummy through vias DTSV4 that is less than half the surface area may overlap with the first front dummy wires DM1$a$.

Detailed descriptions on the first dummy through via DTSV1, the second dummy through via DTSV2, the third dummy through via DTSV3, and the fourth dummy through via DTSV4 will be described later with reference to FIG. 6 to FIG. 9.

FIG. 2 to FIG. 5 show cross-sectional views of a semiconductor device according to some embodiments.

Figure 2:
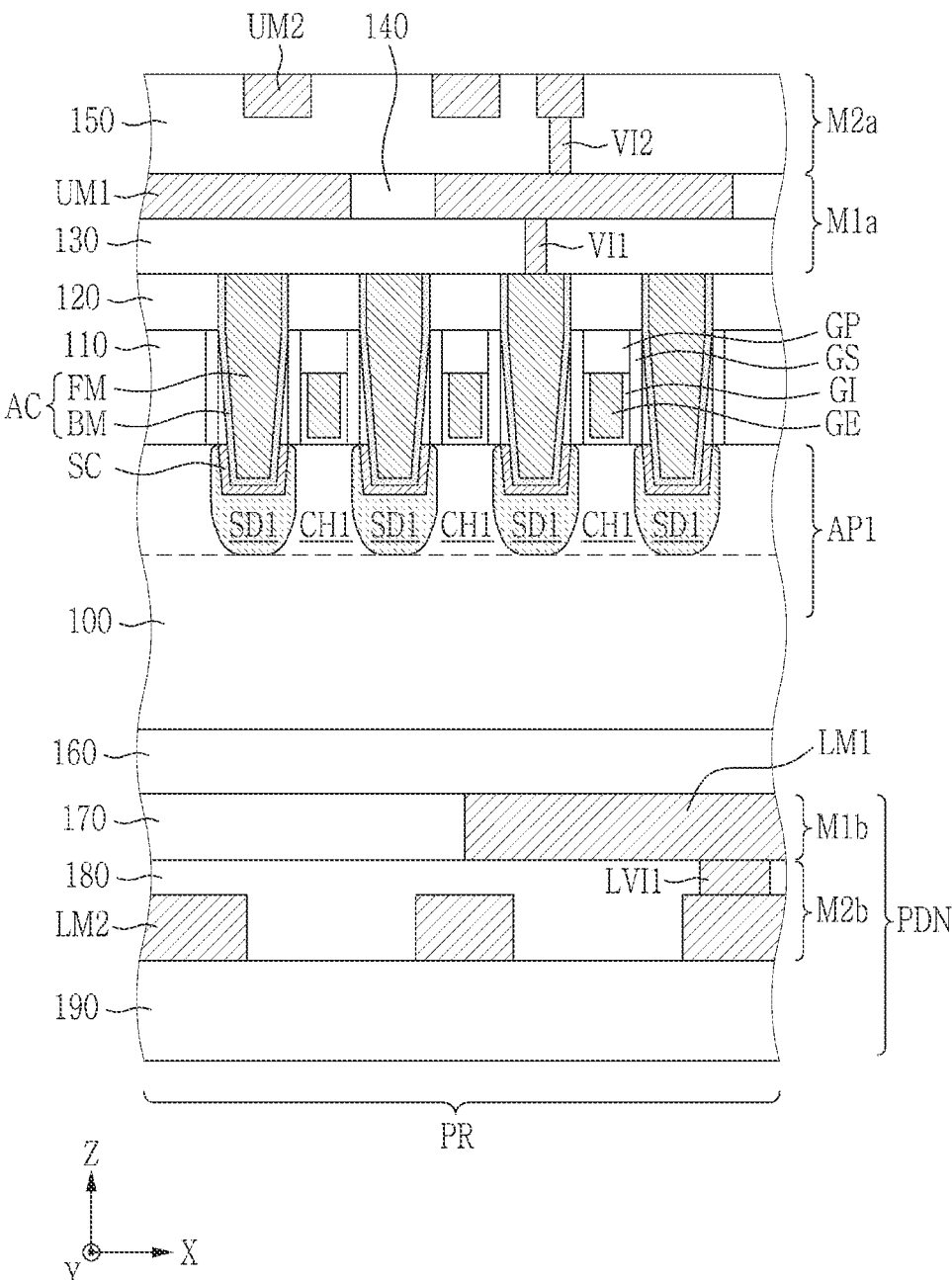
FIG. 2 to FIG. 5 show cross-sectional views of a semiconductor device according to some embodiments.
Figure 3:
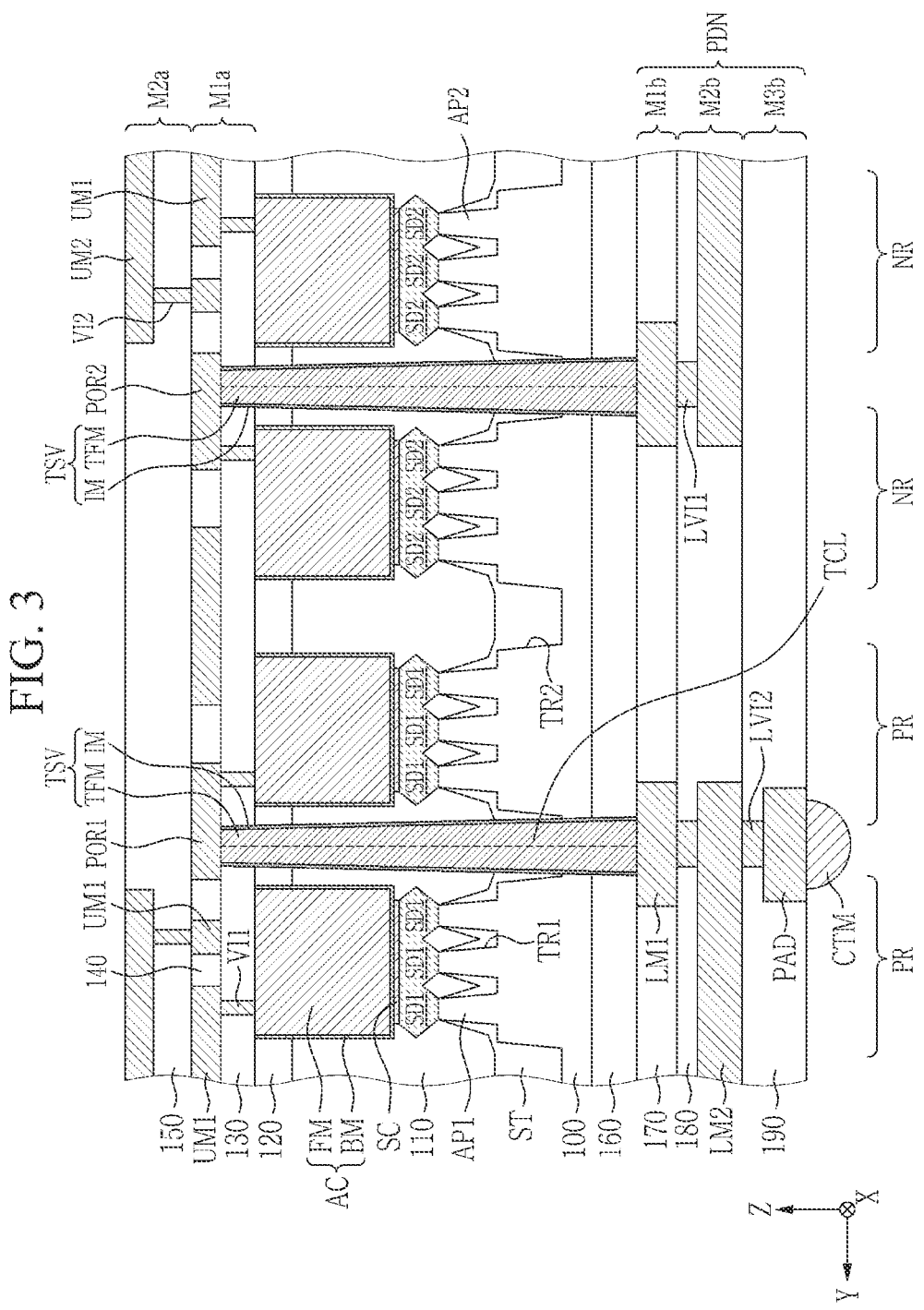

Referring to FIG. 2 and FIG. 3, the substrate 100 may include a first active region PR and a second active region NR. The first active region PR may be a PMOSFET region, and the second active region NR may be an NMOSFET region.

The first active region PR and the second active region NR may be defined by a second trench TR2 formed on an upper portion of the substrate 100. The second trench TR2 may be disposed between the first active region PR and the second active region NR. The second trench TR2 may be disposed among the adjacent first active regions PR and among the adjacent second active regions NR. The first active region PR may be spaced apart from the second active region NR with second trench TR2 therebetween.

First active patterns AP1 and second active patterns AP2 may be disposed in the first active region PR and the second active region NR. The first active patterns AP1 and second active patterns AP2 are part of the substrate 100, and may protrude perpendicularly. A plurality of first trenches TR1 may be defined among the adjacent first active patterns AP1 and among the adjacent second active patterns AP2. The first trench TR1 may be thinner than the second trench TR2.

An isolation layer ST may fill the first trenches TR1 and second trenches TR2. The isolation layer ST may include a silicon oxide layer. In some embodiments, upper portions of the first and second active patterns AP1 and AP2 may perpendicularly protrude above the isolation layer ST.

The respective upper portions of the first and second active patterns AP1 and AP2 may have a fin shape. The isolation layer ST may not cover the upper portions of the first and second active patterns AP1 and AP2. The isolation layer ST may cover lower sidewalls of the first and second active patterns AP1 and AP2.

First source/drain patterns SD1 may be disposed on the upper portions of the first active patterns AP1. The first source/drain patterns SD1 may be first conductivity type (e.g., p-type) extrinsic regions. A first channel pattern CH1 may be provided between a pair of first source/drain patterns SD1. Second source/drain patterns SD2 may be disposed on upper portions of the second active patterns AP2. The second source/drain patterns SD2 may be second conductivity type (e.g., n-type) extrinsic regions. A second channel pattern may be provided between a pair of second source/drain patterns SD2 in a like way that the first channel pattern CH1 is provided between the first source/drain patterns SD1.

The first and second source/drain patterns SD1 and SD2 may be epitaxial patterns formed by a selective epitaxial growth process. The upper sides of the first source/drain pattern SD1 may be positioned on a same level as the upper sides of the first channel pattern CH1. The upper sides of the second source/drain pattern SD2 may be positioned on a same level as the upper sides of the second channel pattern.

The first source/drain patterns SD1 may include a semiconductor element (e.g., SiGe) having a lattice constant that is greater than a lattice constant of the semiconductor element of the substrate 100, and the second source/drain patterns SD2 may include the same semiconductor element (e.g., Si) as the substrate 100. However, the disclosure is not limited thereto.

Gate electrodes GE traversing the first active patterns AP1 and second active patterns AP2 and extending in the second direction (or Y direction) may be disposed. The gate electrodes GE may perpendicularly overlap the first channel pattern CH1. The respective gate electrodes GE may surround an upper side and both sidewalls of the respective first channel patterns CH1. The gate electrodes GE may perpendicularly overlap the second channel patterns, and may surround an upper side and both sidewalls of the respective second channel patterns.

The transistor may be a three-dimensional (3D) field effect transistor (e.g., FinFET) in which the gate electrode GE surrounds the first channel pattern CH1 in a 3D way.

A gate spacer GS may be disposed on opposite sidewalls of the respective gate electrodes GE. The gate spacers GS may extend in the second direction (or Y direction) along the gate electrode GE. An upper side of the gate spacer GS may be disposed on a higher level than the upper side of the gate electrode GE. The upper side of the gate spacer GS may be disposed on the same level as the upper side of the first interlayer insulating layer 110.

The gate spacer GS may include at least one of SiCN, SiCON, and SiN. However, without being limited thereto, in some embodiments, the gate spacer GS may include a multilayer made of at least two of SiCN, SiCON, and SiN.

A gate capping pattern GP may be disposed on the respective gate electrodes GE. The gate capping pattern GP may extend in the second direction (or Y direction) along the gate electrode GE. The gate capping pattern GP may include a material having etching selectivity on first insulating layers 110 and second interlayer insulating layers 120 to be described. In detail, the gate capping pattern GP may include at least one of SiON, SiCN, SiCON, and SiN.

A gate dielectric pattern GI may be provided between the gate electrode GE and the first active pattern AP1. The gate dielectric pattern GI may surround the gate electrode GE, and may extend in the second direction (or Y direction).

The gate dielectric pattern GI may include a high dielectric constant material having a greater dielectric constant than the silicon oxide layer. For example, the high dielectric constant material may include at least one of a hafnium oxide, a hafnium silicon oxide, a hafnium zirconium oxide, a hafnium tantalum oxide, a lanthanum oxide, zirconium oxide, a zirconium silicon oxide, a tantalum oxide, a titanium oxide, a barium strontium titanium oxide, a barium titanium oxide, a strontium titanium oxide, a lithium oxide, an aluminum oxide, a lead scandium tantalum oxide, and a lead zinc niobate. However, the disclosure is not limited thereto.

The gate electrode GE may include a first metal pattern and a second metal pattern on the first metal pattern. The first metal pattern may be disposed on the gate dielectric pattern GI, and may be near the first channel pattern CH1. The first metal pattern may include a work function metal for adjusting a threshold voltage of the transistor. The target threshold voltage may be achieved by adjusting a thickness and a composition of the first metal pattern.

The first metal pattern may include a metal nitride layer. For example, the first metal pattern may include at least one metal of titanium (Ti), tantalum (Ta), aluminum (Al), tungsten (W), and molybdenum (Mo), and nitrogen (N). The first metal pattern may further include carbon (C). The first metal pattern may include a plurality of stacked work function metal layers.

The second metal pattern may include a metal having lower electrical resistance than the first metal pattern. For example, the second metal pattern may include at least one metal of tungsten (W), aluminum (Al), titanium (Ti), and tantalum (Ta).

A first interlayer insulating layer 110 may be disposed on the substrate 100. The first interlayer insulating layer 110 may cover the gate spacers GS and the first and second source/drain patterns SD1 and SD2. An upper side of the first interlayer insulating layer 110 may be positioned on the substantially equivalent level to the upper sides of the gate capping pattern GP and the upper sides of the gate spacers GS.

A second interlayer insulating layer 120 for covering the gate capping pattern GP may be disposed on the first interlayer insulating layer 110. A third interlayer insulating layer 130 may be disposed on the second interlayer insulating layer 120. A fourth interlayer insulating layer 140 may be disposed on the third interlayer insulating layer 130. A fifth interlayer insulating layer 150 may be disposed on the fourth interlayer insulating layer 140.

The first to fifth interlayer insulating layers 110, 120, 130, 140, and 150 may include silicon oxide layers. However, the disclosure is not limited thereto.

Active contacts AC may pass through the first and second interlayer insulating layers 110 and 120, and may be electrically connected to the first source/drain patterns SD1 and second source/drain patterns SD2. The active contact AC may have a bar shape extending in the third direction (or Z direction). However, the shape of the active contact AC is not limited thereto and may be modifiable in many ways.

The active contact AC may be connected to the first source/drain patterns SD1 or the second source/drain patterns SD2.

The active contact AC may be a self-aligned contact. The active contact AC may be formed in a self-aligned way by using the gate capping pattern GP and the gate spacer GS. For example, the active contact AC may contact at least part of the sidewall of the gate spacer GS and may cover part of the gate spacer GS. In some embodiments, the active contact AC may cover part of the upper side of the gate capping pattern GP.

A silicide pattern SC may be provided between the active contact AC and the first source/drain pattern SD1 and between the active contact AC and the second source/drain pattern SD2. The active contact AC may be electrically connected to the first and second source/drain patterns SD1 and SD2 through the silicide pattern SC.

The silicide pattern SC may include a metal-silicide, for example, the silicide pattern SC may include at least one of a titanium-silicide, a tantalum-silicide, a tungsten-silicide, a nickel-silicide, and a cobalt-silicide. However, the disclosure is not limited thereto.

The active contact AC may include a conductive pattern FM and a barrier pattern BM surrounding the conductive pattern FM. For example, the conductive pattern FM may include at least one metal of aluminum, copper, tungsten, molybdenum, and cobalt. However, the disclosure is not limited thereto.

The barrier pattern BM may cover sidewalls and a bottom side of the conductive pattern FM. The barrier pattern BM may include a metal layer/metal nitride layer.

The metal layer may, for example, include at least one of titanium, tantalum, tungsten, nickel, cobalt, and platinum. The metal nitride layer may, for example, include at least one of a titanium nitride layer (TiN), a tantalum nitride layer (TaN), a tungsten nitride layer (WN), a nickel nitride layer (NiN), a cobalt nitride layer (CoN), and a platinum nitride layer (PtN).

A first front wire M1a may be provided into the third interlayer insulating layer 130 and the fourth interlayer insulating layer 140. The first front wire M1a disposed in the above-described cell region may include first upper wires UM1, a first power supplying wire POR1, and a second power supplying wire POR2.

A power source voltage and a ground voltage may be applied to the first and second power supplying wires POR1 and POR2. The ground voltage may be applied to the first source/drain patterns SD1 and the second source/drain patterns SD2 through the active contact AC. The first power supplying wire POR1 may be disposed among the adjacent first active regions PR, and the second power supplying wire POR2 may be disposed among the adjacent second active regions NR.

The first front wire M1a may further include a first vias VI1. First vias VI1 may be disposed on lower portions of the first upper wires UM1.

The first via VI1 may pass through the third interlayer insulating layer 130 and may be provided between the active contact AC and the first upper wire UM1, and may electrically connect them. The first vias VI1 may be provided between the active contact AC and the first power supplying wire POR1 and between the active contact AC and the second power supplying wire POR2, and may electrically connect them.

The second front wire M2a may be disposed in the fifth interlayer insulating layer 150. The second front wire M2a may include second upper wires UM2 and second vias VI2.

The respective second vias VI2 may pass through the fifth interlayer insulating layer 150 and may be provided between the first upper wires UM1 and the second upper wires UM2. The second upper wires UM2 may be electrically connected to the first upper wires UM1 through the second vias VI2.

The first front wires M1a and the second front wires M2a may include equivalent or different conducting materials. For example, the first front wire M1a and the second front wire M2a may include at least one metallic material of aluminum, copper, tungsten, molybdenum, and cobalt.

A sixth interlayer insulating layer 160, a seventh interlayer insulating layer 170, an eighth interlayer insulating layer 180, and a ninth interlayer insulating layer 190 may be sequentially stacked on the second side of the substrate 100.

The power delivery network PDN may include first rear wires M1b, second rear wires M2b, and third rear wires M3b.

The first rear wire M1b may include first lower wires LM1, the second rear wire M2b may include first lower vias LVI1 and second lower wires LM2, and the third rear wire M3b may include a second lower via LVI2 and a pad wire PAD.

The first lower wires LM1 may be disposed in the seventh interlayer insulating layer 170. The second lower wire LM2 may be disposed at a lower portion of the eighth interlayer insulating layer 180, and the first lower via LVI1 may be provided between the first lower wire LM1 and the second lower wire LM2 at the upper portion of the eighth interlayer insulating layer 180 to electrically connect the first lower wire LM1 and the second lower wire LM2.

The pad wire PAD may be disposed at a lower portion of the ninth interlayer insulating layer 190, and the second lower via LVI2 may be provided between the second lower wire LM2 and the pad wire PAD at the upper portion of the ninth interlayer insulating layer 190 to electrically connect the second lower wire LM2 and the pad wire PAD.

The power delivery network PDN may configure a wire network for applying voltages to the first and second power supplying wires POR1 and POR2. An external connecting member CTM may be provided on the bottom side of the pad wire PAD. The external connecting member CTM may include a solder, a bump, a filler, and/or combinations thereof. However, the disclosure is not limited thereto.

The through vias TSV may pass through the substrate 100 and may extend to the first front wire M1a from the first rear wire M1b. The through vias TSV may sequentially pass through the sixth interlayer insulating layer 160 disposed on the second side of the substrate 100, the substrate 100, the isolation layer ST filling the trench TR2, and the first to third interlayer insulating layers 110, 120, and 130, the lower side of the through via TSV may be connected to the first rear wire M1b, and the upper side of the through via TSV may be connected to the first power supplying wire POR1 and/or the second power supplying wire POR2 of the first front wire M1a.

The voltage may be applied to the first and second power supplying wires POR1 and POR2 from the power delivery network PDN through the through via TSV. For example, the power voltage may be applied to the first power supplying wire POR1 from the external connecting member CTM through the power delivery network PDN and the through via TSV.

The through via TSV may have a column shape extending in a perpendicular direction, that is, the third direction (or Z direction). For example, the through vias TSV may have a column shape, which can become narrower and may have an inclined lateral side when approaching the first power supplying wire POR1 and/or the second power supplying wire POR2 from the first lower wire LM1 according to an aspect ratio. The width of the through via TSV may be reduced when approaching the first power supplying wire POR1 and/or the second power supplying wire POR2 from the first lower wire LM1. However, the shape of the through vias TSV is not limited thereto and may be modifiable in many ways. For example, in some embodiments, the through via TSV may have a column shape such as a cylinder or a prismatic column.

A center axis TCL of the through via TSV for connecting the first power supplying wire POR1 and the first lower wire LM1 overlaps the first power supplying wire POR1 and the first lower wire LM1, and a center axis TCL of the through via TSV for connecting the second power supplying wire POR2 and the first lower wire LM1 overlaps the second power supplying wire POR2 and the second lower wire LM2. For example, the center of the through via TSV, the center of the first power supplying wire POR1, and the center of the first lower wire LM1 may be disposed in the same line in the third direction (or Z direction). However, without being limited thereto, in some embodiments, the center axis TCL of the through via TSV for connecting the first power supplying wire POR1 and the first lower wire LM1 may not overlap the first power supplying wire POR1 and the first lower wire LM1.

The through via TSV may include a conductive pattern TFM and an insulating pattern IM that can surround the conductive pattern TFM.

The conductive pattern TFM may include at least one metal of aluminum, copper, tungsten, molybdenum, and cobalt, but is not limited thereto.

The insulating pattern IM may surround the conductive pattern TFM and may be provided between the conductive pattern TFM and the third interlayer insulating layer 130, the conductive pattern TFM and the second interlayer insulating layer 120, the conductive pattern TFM and the first interlayer insulating layer 110 and between the conductive pattern TFM and the isolation layer ST.

The insulating pattern IM may include an insulating material such as an oxide layer, a nitride layer, a carbonaceous layer, a polymer, or combinations thereof, but is not limited thereto.

In some embodiments, the through via TSV may further include a barrier pattern BM provided between the conductive pattern TFM and the insulating pattern IM, for example, the pattern may include the same material as the barrier pattern BM of the above-described active contact AC. However, the disclosure is not limited thereto.

FIG. 1 shows that the first front wire M1a is formed on the first side of the substrate 100 and the first rear wire M1b is formed on the second side, FIG. 2 and FIG. 3 show that the first front wire M1a and the second front wire M2a are formed on the first side of the substrate 100, and that the first rear wire M1b, the second rear wire M2b, and the third rear wire M3b are formed on the second side. This is, however, for better understanding and ease of description, and referring to FIG. 1 to FIG. 3, front wires such as the second front wire, the third front wire, the fourth front wire, the fifth front wire, and the sixth front wire may be further formed on the first side of the substrate 100, and the rear wires such as the second rear wire, the third rear wire, the fourth rear wire, the fifth rear wire, and the sixth rear wire may be further formed on the second side of the substrate 100.

Figure 4:
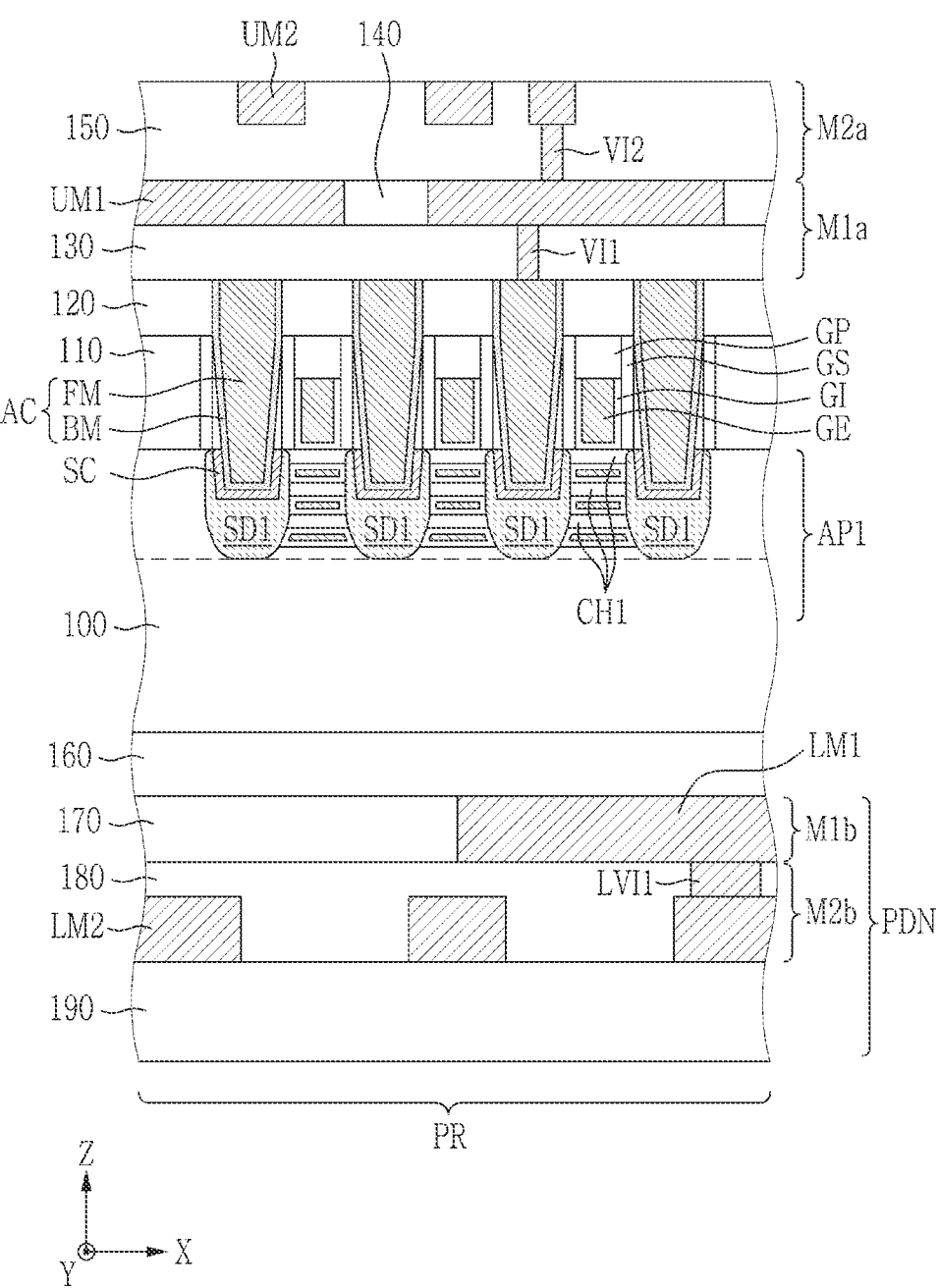
Figure 5:
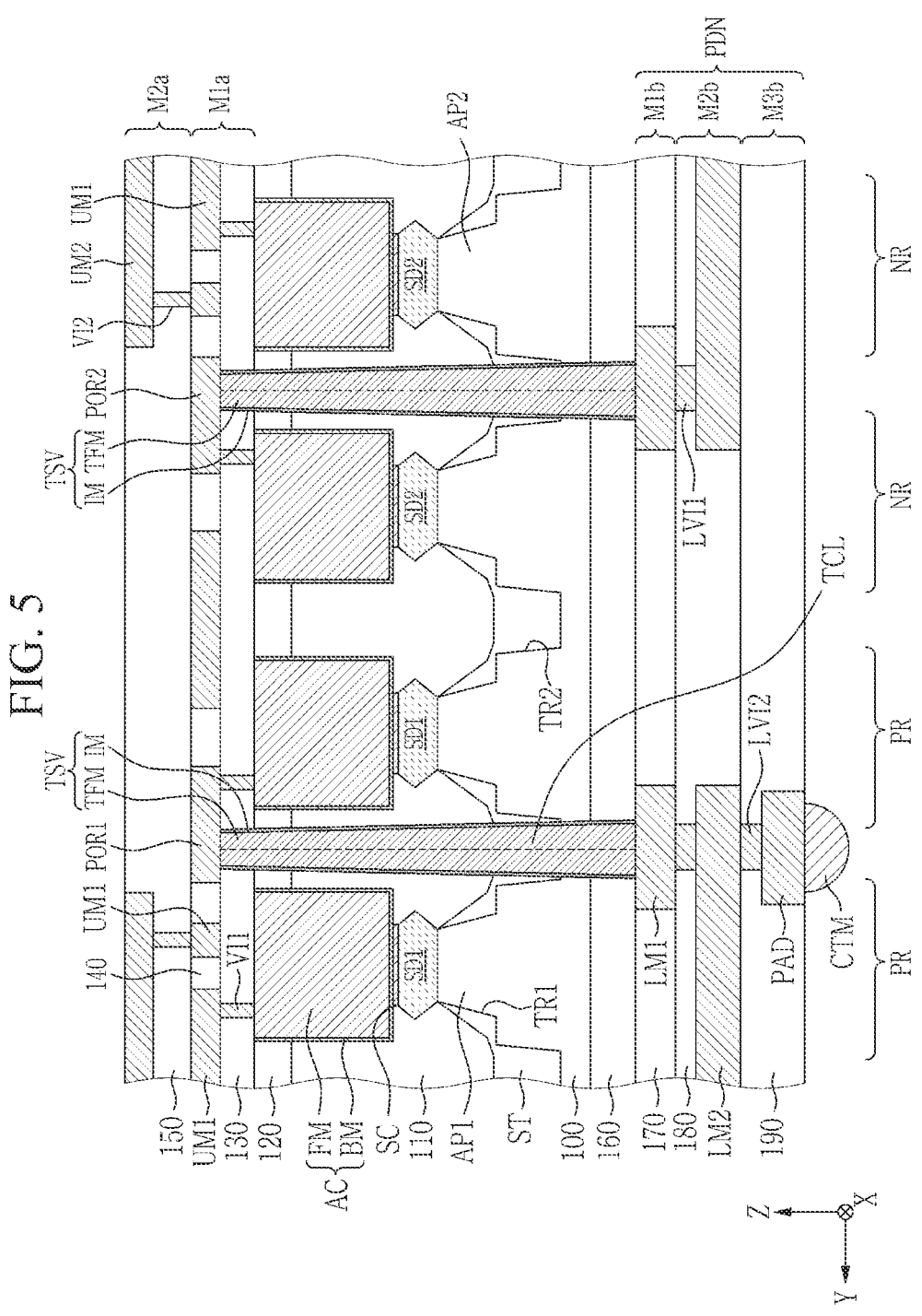

FIG. 4 and FIG. 5 show cross-sectional views of a semiconductor device according to some embodiments.

Referring to FIG. 4 and FIG. 5, the first active pattern AP1 may include first channel patterns CH1 stacked in the perpendicular direction. The stacked first channel patterns CH1 may be spaced apart from each other in the perpendicular direction, and may overlap each other in the perpendicular direction. The second active pattern AP2 may include second channel patterns stacked in the perpendicular direction. The stacked second channel patterns may overlap each other in the perpendicular direction. The first channel patterns CH1 may include at least one of silicon (Si), germanium (Ge), and silicon-germanium (SiGe). The second channel patterns may also include the same material as the first channel patterns CH1.

The first active pattern AP1 may further include first source/drain patterns SD1. The stacked first channel patterns CH1 may be provided among the pair of adjacent first source/drain patterns SD1. The stacked first channel patterns CH1 may connect the pair of adjacent first source/drain patterns SD1.

The second active pattern AP2 may further include second source/drain patterns SD2. The stacked second channel patterns may be provided between the pair of adjacent second source/drain patterns SD2. The stacked second channel patterns may connect the pair of adjacent second source/drain patterns SD2.

Gate electrodes GE traversing the first channel patterns CH1 and extending in the second direction (or Y direction) may be provided. The gate electrodes GE may perpendicularly overlap the first channel patterns CH1. In a like way of the first channel patterns CH1, the gate electrodes GE traversing the second channel patterns and extending in the second direction (or Y direction) may be provided. The gate electrode GE may perpendicularly overlap the second channel patterns. The gate electrode GE may surround at least a portion of the underlying channel pattern, where the gate electrode GE can form a gate-all-around (GAA) structure on the channel pattern.

One pair of gate spacers GS may be disposed on respective sidewalls of the gate electrode GE. A gate capping pattern GP may be provided on the gate electrode GE.

The gate electrode GE may surround the respective first channel patterns CH1. The gate electrode GE may surround upper sides, bottom sides, and respective sidewalls of the first channel patterns CH1. A transistor according to the embodiment may be a 3D field effect transistor (e.g., MBCFET or GAAFET) in which the gate electrode GE surrounds the first channel patterns CH1 in a 3D way. The structure and content of the above-described first channel patterns CH1 and the gate electrodes GE may be substantially equivalently applied to the second channel patterns.

A plurality of dummy through vias DTSV included in a cell region of a semiconductor device according to an embodiment will now be described with reference to FIG. 1 and FIG. 6 to FIG. 9.

Figure 6:
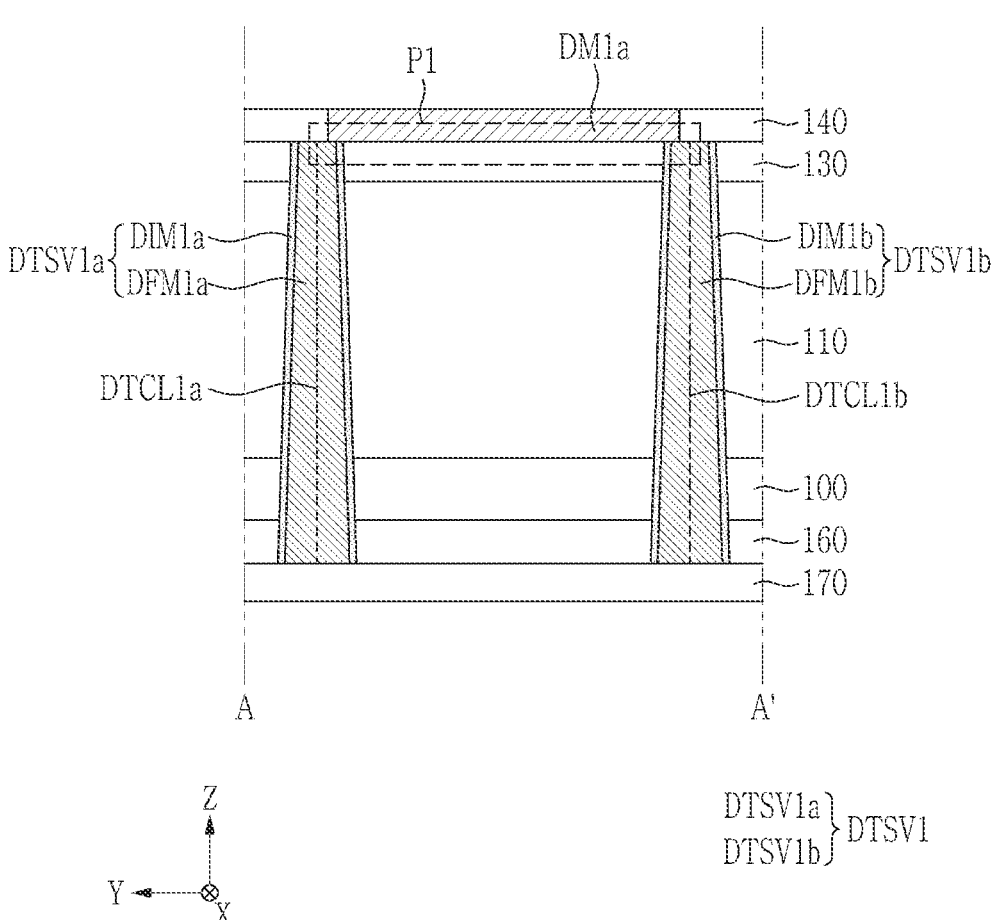
FIG. 6 shows a cross-sectional view with respect to a line A-A' of FIG. 1.
Figure 7:
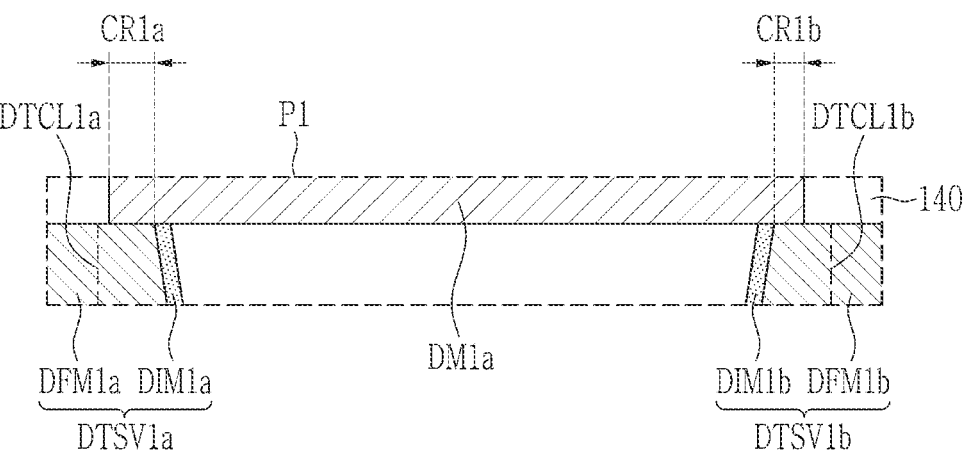
FIG. 7 shows an enlarged view of a region P1 of FIG. 6.
Figure 7:
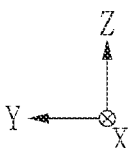
Figure 8:
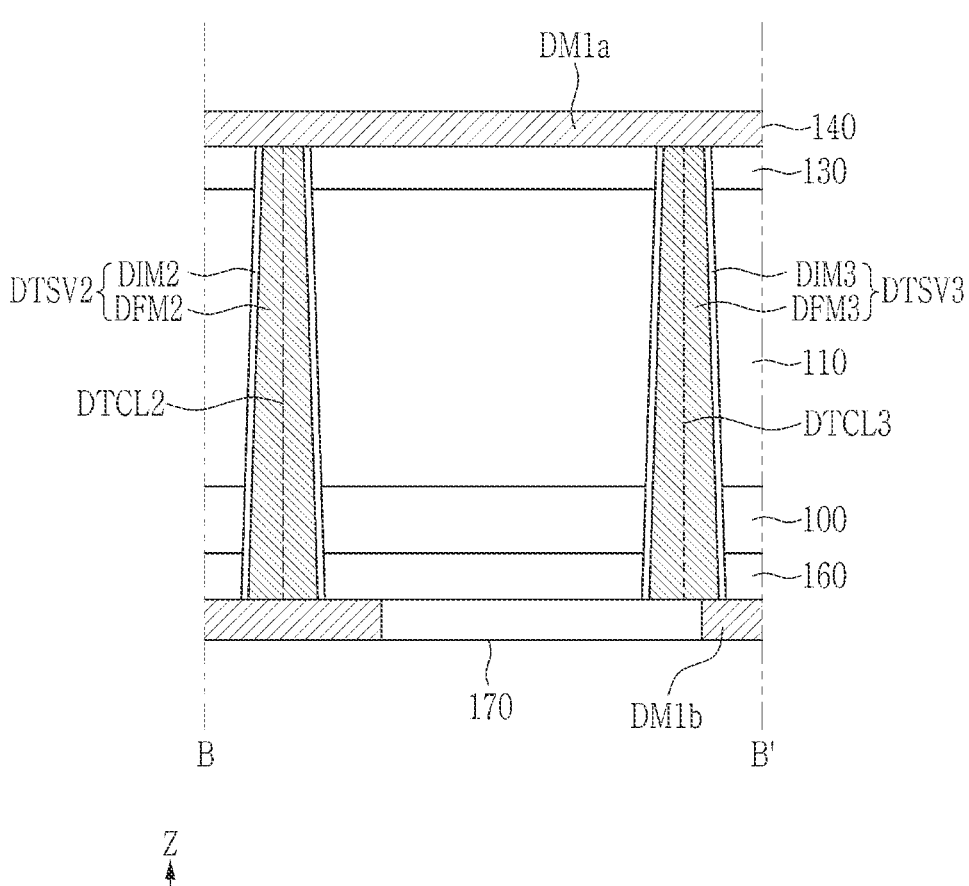
FIG. 8 shows a cross-sectional view with respect to a line B-B' of FIG. 1.
Figure 9:
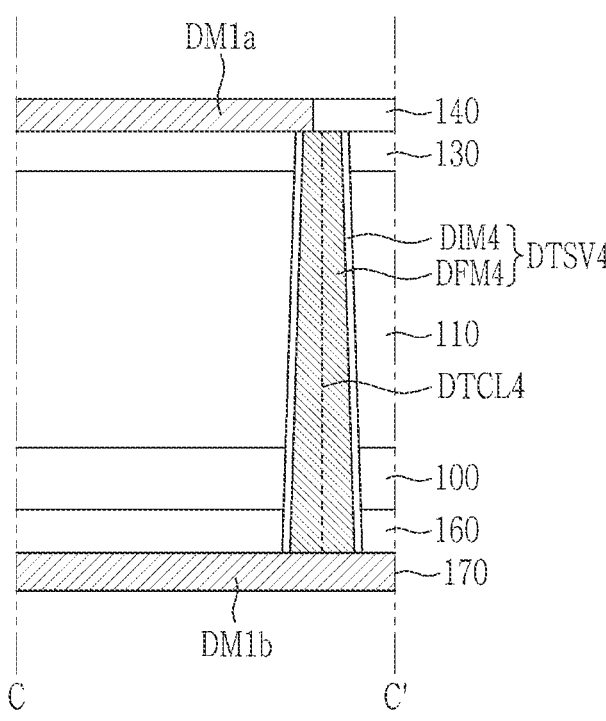
FIG. 9 shows a cross-sectional view with respect to a line C-C' of FIG. 1.
Figure 9:
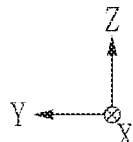

FIG. 6 shows a cross-sectional view with respect to a line A-A' of FIG. 1. FIG. 7 shows an enlarged view of a region P1 of FIG. 6. FIG. 8 shows a cross-sectional view with respect to a line B-B' of FIG. 1. FIG. 9 shows a cross-sectional view with respect to a line C-C' of FIG. 1.

For better understanding and ease of description, FIG. 6, FIG. 8, and FIG. 9 mainly show constituent elements disposed around the dummy through via DTSV while omitting the fifth interlayer insulating layer 150 disposed on the first side of the substrate 100, and the eighth interlayer insulating layer 180 and the ninth interlayer insulating layer 190 disposed on the second side of the substrate 100.

Referring to FIG. 1, FIG. 6, and FIG. 7, first dummy through vias DTSV1 overlapping part of the first front dummy wire DM1a may be disposed in the cell region of the semiconductor device.

The first front dummy wire DM1a may be disposed in the fourth interlayer insulating layer 140. The first front dummy wire DM1a may include the same material as the above-described first front wire (refer to 'M1a' of FIG. 2). However, the disclosure is not limited thereto.

The fourth interlayer insulating layer 140 may be a stopper insulation layer in a process for forming the first dummy through via DTSV1. The fourth interlayer insulating layer 140 may be used as an etch stopping layer for preventing the interlayer insulating layer disposed on the fourth interlayer insulating layer 140 from being etched in an etching process for forming the first dummy through via DTSV1. In some embodiments, the fourth interlayer insulating layer 140 may be omitted.

The first dummy through via DTSV1 may extend to the upper side of the third interlayer insulating layer 130 disposed on the first side of the substrate 100 from the lower side of the sixth interlayer insulating layer 160 disposed on the second side of the substrate 100. The first dummy through via DTSV1 may pass through the sixth interlayer insulating layer 160, the substrate 100, the first interlayer insulating layer 110, and the third interlayer insulating layer 130, part of the upper side of the first dummy through via DTSV1 may contact the first front dummy wire DM1a, and the lower side may contact the upper side of the seventh interlayer insulating layer 170.

In detail, as shown in FIG. 1 and FIG. 6, a center of the first dummy through vias DTSV1 may not overlap the first front dummy wire DM1a, may not overlap the first rear dummy wire DM1b, and may pass through the substrate 100. The center of the first dummy through vias DTSV1 may be laterally offset from an edge of the first front dummy wire DM1a and an edge of the first rear dummy wire DM1b, where a portion of less than half of the top surface of the first dummy through vias DTSV1 may overlap with the first front dummy wire DM1a, and the bottom surface of the first dummy through vias DTSV1 may overlap and be in physical contact with the seventh interlayer insulating layer 170.

The first dummy through via DTSV1 may include a first-1 dummy through via DTSV1a and a first-2 dummy through via DTSV1b disposed on one side of the first front dummy wire DM1a disposed in the cell region. A center of the first-1 dummy through via DTSV1a may not overlap the first front dummy wire DM1a and may not overlap the first rear dummy wire DM1$b$, and a center of the first-2 dummy through via DTSV1$b$ may not overlap the first front dummy wire DM1$a$ and may not overlap the first rear dummy wire DM1$b$. The center of the first-1 dummy through via DTSV1$a$ may be laterally offset from an edge of the first front dummy wire DM1$a$ and an edge of the first rear dummy wire DM1$b$, and a center of the first-2 dummy through via DTSV1$b$ may be laterally offset from an edge of the first front dummy wire DM1$a$ and an edge of the first rear dummy wire DM1$b$. A portion of the top surface of the first-1 dummy through via DTSV1$a$ may overlap a portion of the first front dummy wire DM1$a$, and a portion of the top surface of the first-2 dummy through via DTSV1$b$ may overlap a portion of the first front dummy wire DM1$a$. A portion of the bottom surface of the first-1 dummy through via DTSV1$a$ may overlap a portion of the first rear dummy wire DM1$b$, and a portion of the bottom surface of the first-2 dummy through via DTSV1$b$ may overlap a portion of the first rear dummy wire DM1$b$.

In detail, center axes DTCL1$a$ and DTCL1$b$ of the first dummy through via DTSV1 may not overlap the first front dummy wire DM1$a$. The center axes DTCL1$a$ and DTCL1$b$ of the first dummy through via DTSV1 may be alternately disposed in the direction perpendicular to the first front dummy wire DM1$a$, and may be spaced apart from an end portion of the first front dummy wire DM1$a$ in the perpendicular direction. Accordingly, a lower side of the first front dummy wire DM1$a$ may contact part of the upper side of the first dummy through vias DTSV1. However, without being limited thereto, in some embodiments, center axes DTCL1$a$ and DTCL1$b$ of the first dummy through via DTSV1 may overlap the first front dummy wire DM1$a$, and part of the upper side of the first dummy through via DTSV1 may overlap the first front dummy wire DM1$a$.

As shown in FIG. 7, the first front dummy wire DM1$a$ may include a first contact portion CR1$a$ contacting the first-1 dummy through via DTSV1$a$ and a second contact portion CR1$b$ contacting the first-2 dummy through via DTSV1$b$, and an area of the first contact portion CR1$a$ may be different from an area of the second contact portion CR1$b$. For example, the area of the first contact portion CR1$a$ may be greater than the area of the second contact portion CR1$b$. However, without being limited thereto, in some embodiments, the area of the first contact portion CR1$a$ may be equivalent to the area of the second contact portion CR1$b$.

Here, the first-1 dummy through via DTSV1$a$ overlaps the first front dummy wire DM1$a$ at the first contact portion CR1$a$ in the third direction (or Z direction), and the first-2 dummy through via DTSV1$b$ overlaps the first front dummy wire DM1$a$ at the second contact portion CR1$b$ in the third direction (or Z direction).

The first-1 dummy through via DTSV1$a$ and the first-2 dummy through via DTSV1$b$ may respectively include first dummy conductive patterns DFM1$a$ and DFM1$b$ and first dummy insulating patterns DIM1$a$ and DIM1$b$ surrounding the first dummy conductive patterns DFM1$a$ and DFM1$b$.

The first dummy through vias DTSV1 may be made by the same process as above-described through vias TSV. In addition, the second dummy through via to ninth dummy through vias DTSV2, DTSV3, DTSV4, DTSV5, DTSV6, DTSV7, DTSV8, and DTSV9 to be described may be made according to the same process as the above-described through vias TSV in a like way of the first dummy through via DTSV1.

Therefore, the first dummy conductive patterns DFM1$a$ and DFM1$b$ may include the same material as the conductive pattern TFM of the above-described through via TSV, and the first dummy insulating patterns DIM1$a$ and DIM1$b$ may include the same material as the insulating pattern IM of the above-described through via TSV. However, the disclosure is not limited thereto.

In some embodiments, the first-1 dummy through via DTSV1$a$ and the first-2 dummy through via DTSV1$b$ may further include a dummy barrier pattern provided between the first dummy conductive patterns DFM1$a$ and DFM1$b$ and the first dummy insulating patterns DIM1$a$ and DIM1$b$, and the dummy barrier pattern may include the same material as the barrier pattern of the above-described through via TSV.

Referring to FIG. 8, the second dummy through vias DTSV2 and the third dummy through vias DTSV3 may be disposed in the cell region of the semiconductor device. The second dummy through vias DTVS2 may completely overlap the first front dummy wire DM1$a$ and the first rear dummy wire DM1$b$. The third dummy through vias DTSV3 may completely overlap the first front dummy wire DM1$a$, and may overlap part of the first rear dummy wire DM1$b$.

The first rear dummy wire DM1$b$ may be disposed in the seventh interlayer insulating layer 170.

The first rear dummy wire DM1$b$ may include the same material as the above-described first rear wire (refer to 'M1$b$' of FIG. 2). However, the disclosure is not limited thereto.

The seventh interlayer insulating layer 170 may be the same stopper insulation layer as the above-described fourth interlayer insulating layer 140 in the process for forming the second dummy through via DTSV2 and/or the third dummy through via DTSV3. In some embodiments, the seventh interlayer insulating layer 170 may be omitted.

The second dummy through via DTSV2 and the third dummy through via DTSV3 may extend to the lower side of the first front dummy wire DM1$a$ from the upper side of the first rear dummy wire DM1$b$. The second dummy through via DTSV2 and the third dummy through via DTSV3 may pass through the sixth interlayer insulating layer 160, the substrate 100, the first interlayer insulating layer 110, and the third interlayer insulating layer 130.

An entire upper side of the second dummy through via DTSV2 may contact the lower side of the first front dummy wire DM1$a$, and an entire lower side may contact the first rear dummy wire DM1$b$. The center axis DTCL2 of the second dummy through via DTSV2 may completely overlap the first front dummy wire DM1$a$ and the first rear dummy wire DM1$b$, where the edge of the first rear dummy wire DM1$b$ can extend laterally passed the edge of the second dummy through via DTSV2.

An entire upper side of the third dummy through via DTSV3 may contact the lower side of the first front dummy wire DM1$a$, and part of the lower side may contact the first rear dummy wire DM1$b$. The center axis DTCL3 of the third dummy through via DTSV3 may overlap the first front dummy wire DM1$a$, and may not overlap the first rear dummy wire DM1$b$, where the center axis DTCL3 of the third dummy through via DTSV3 extends passed the edge of the first rear dummy wire DM1$b$. However, without being limited thereto, in some embodiments, the center axis DTCL3 of the third dummy through via DTSV3 may overlap the first front dummy wire DM1$a$ and the first rear dummy wire DM1$b$. In this instance, an entire upper side of the third dummy through via DTSV3 may overlap the first front dummy wire DM1$a$, and part of the lower side may overlap the first rear dummy wire DM1$b$. A portion of the bottom surface of the third dummy through via DTSV3 can be in contact with the first rear dummy wire DM1b.

The second dummy through via DTSV2 and the third dummy through via DTSV3 may, in a like way of the above-described first dummy through via DTSV1, include second and third dummy conductive patterns DFM2 and DFM3, respectively, and second and third dummy insulating patterns DIM2 and DIM3 surrounding the second and third dummy conductive patterns DFM2 and DFM3.

The second and third dummy conductive patterns DFM2 and DFM3 may include the same material as the conductive pattern TFM of the above-described through via TSV, and the second and third dummy insulating patterns DIM2 and DIM3 may include the same material as the insulating pattern IM of the above-described through via TSV. However, the disclosure is not limited thereto.

In some embodiments, the second dummy through via DTSV2 and the third dummy through via DTSV3 may respectively further include a dummy barrier pattern provided between the second and third dummy conductive patterns DFM2 and DFM3 and the second and third dummy insulating patterns DIM2, and DIM3, and the dummy barrier pattern may include the same material as the barrier pattern of the above-described through via TSV.

Referring to FIG. 9, fourth dummy through vias DTSV4 overlapping some of the first front dummy wire DM1a and completely overlapping the first rear dummy wire DM1b may be disposed in the cell region of the semiconductor device.

The fourth dummy through via DTSV4 may extend to the lower side of the first front dummy wire DM1a from the upper side of the first rear dummy wire DM1b. The fourth dummy through via DTSV4 may pass through the sixth interlayer insulating layer 160, the substrate 100, the first interlayer insulating layer 110, and the third interlayer insulating layer 130.

Part of the upper side of the fourth dummy through via DTSV4 may contact the lower side of the first front dummy wire DM1a, and the entire lower side may contact the upper side of the first rear dummy wire DM1b. The center axis DTCL4 of the fourth dummy through via DTSV4 may not overlap the first front dummy wire DM1a, and the center axis DTCL4 and the end portion of the first front dummy wire DM1a may be alternately disposed in the third direction (or Z direction). The center axis DTCL4 of the fourth dummy through via DTSV4 extends passed the edge of the first front dummy wire DM1a. The center axis DTCL4 of the fourth dummy through via DTSV4 may overlap the first rear dummy wire DM1b.

In various embodiments, the center axis DTCL4 of the fourth dummy through via DTSV4 may overlap the first front dummy wire DM1a and the first rear dummy wire DM1b, part of the upper side of the fourth dummy through via DTSV4 may overlap the first front dummy wire DM1a, and the entire lower side may overlap the first rear dummy wire DM1b.

The fourth dummy through via DTSV4 may, in a like way of the above-described first dummy through via DTSV1, include a fourth dummy insulating pattern DIM4 for surrounding the fourth dummy conductive pattern DFM4 and the fourth dummy conductive pattern DFM4.

The fourth dummy conductive pattern DFM4 may include the same material as the conductive pattern TFM of the above-described through via TSV, and the fourth dummy insulating pattern DIM4 may include the same material as the insulating pattern IM of the above-described through via TSV. However, the disclosure is not limited thereto.

In some embodiments, the fourth dummy through via DTSV4 may further include a dummy barrier pattern provided between the fourth dummy conductive pattern DFM4 and the fourth dummy insulating pattern DIM4, and the dummy barrier pattern may include the same material as the barrier pattern of the above-described through via TSV.

Referring to FIG. 1, the through vias TSV disposed in the cell region of the substrate 100 and the number and the disposition of the dummy through vias DTSV are merely examples, are not limited thereto, and may be modifiable in many ways.

FIG. 1 and FIG. 6 to FIG. 9 show that the first front dummy wire DM1a is formed on the first side of the substrate 100, and the first rear dummy wire DM1b is formed on the second side. However, this is for better understanding and ease of description, and the front dummy wires such as the second front dummy wire, the third front dummy wire, or the fourth front dummy wire may be further formed on the first side of the substrate 100, and the rear dummy wires such as the second rear dummy wire, the third rear dummy wire, or the fourth rear dummy wire may be further formed on the second side of the substrate 100.

Further, FIG. 1 and FIG. 6 to FIG. 9 show that the dummy through vias DTSV pass through the substrate 100 and extend to the first front dummy wire DM1a from the first rear dummy wire DM1b. For example, when the front dummy wires in addition to the first front dummy wire DM1a are further formed on the first side of the substrate 100, and the rear dummy wires in addition to the first rear dummy wire DM1b are further formed on the second side of the substrate 100, the above-described dummy through vias DTSV may pass through the substrate 100 and may extend to the front dummy wires excluding the first front dummy wire DM1a from the rear dummy wires excluding the first rear dummy wire DM1b.

According to an embodiment given with FIG. 1 and FIG. 6 to FIG. 9, regarding the cell region provided on the substrate 100, as the dummy through vias DTSV are formed in the region overlapping one of the first front dummy wire DM1a and the first rear dummy wire DM1b in addition to the region in which the first front dummy wires DM1a traverse the first rear dummy wires DM1b, densities of the through via TSV and the dummy through via DTSV may be constant in a plurality of cell regions included in the substrate 100. As the dummy through vias DTSV overlapping one of the first front dummy wire DM1a and the first rear dummy wire DM1b are additionally formed in a peripheral area of the through vias TSV, a sum of the number of the through vias TSV and the dummy through vias DTSV included in the cell regions may be constant.

For example, the number of the through vias TSV may be relatively fewer in some of the cell regions provided on the substrate 100, and the number of the through vias TSV may be relatively more in other regions. To make the densities of the through via TSV and the dummy through via DTSV constant in the respective cell regions, a relatively greater number of the dummy through vias DTSV may be made in the cell region with a relatively lesser number of the through vias TSV. A relatively lesser number of the dummy through vias DTSV may be made in the cell region with a relatively greater number of the through vias TSV. As described, the densities of the through via TSV and the dummy through via DTSV may be made constant in the respective cell regions by selecting the appropriate number of the dummy through vias DTSV in consideration of the number of the through vias TSV.

As the dummy through vias DTSV are formed in the region overlapping one of the first front dummy wire DM1$a$ and the first rear dummy wire DM1$b$ in addition to the region in which the first front dummy wires DM1$a$ traverse the first rear dummy wires DM1$b$, the sufficient number of the dummy through vias DTSV may be obtained in the cell region with a very much lesser number of the through vias TSV.

By this, the increased reliability of the semiconductor device may be achieved by performing the patterning process, the etching process, and the chemical mechanical polishing (CMP) process.

A plurality of dummy through vias DTSV included in the cell region of the semiconductor device according to some embodiments will now be described with reference to FIG. 10 to FIG. 16.

Figure 10:
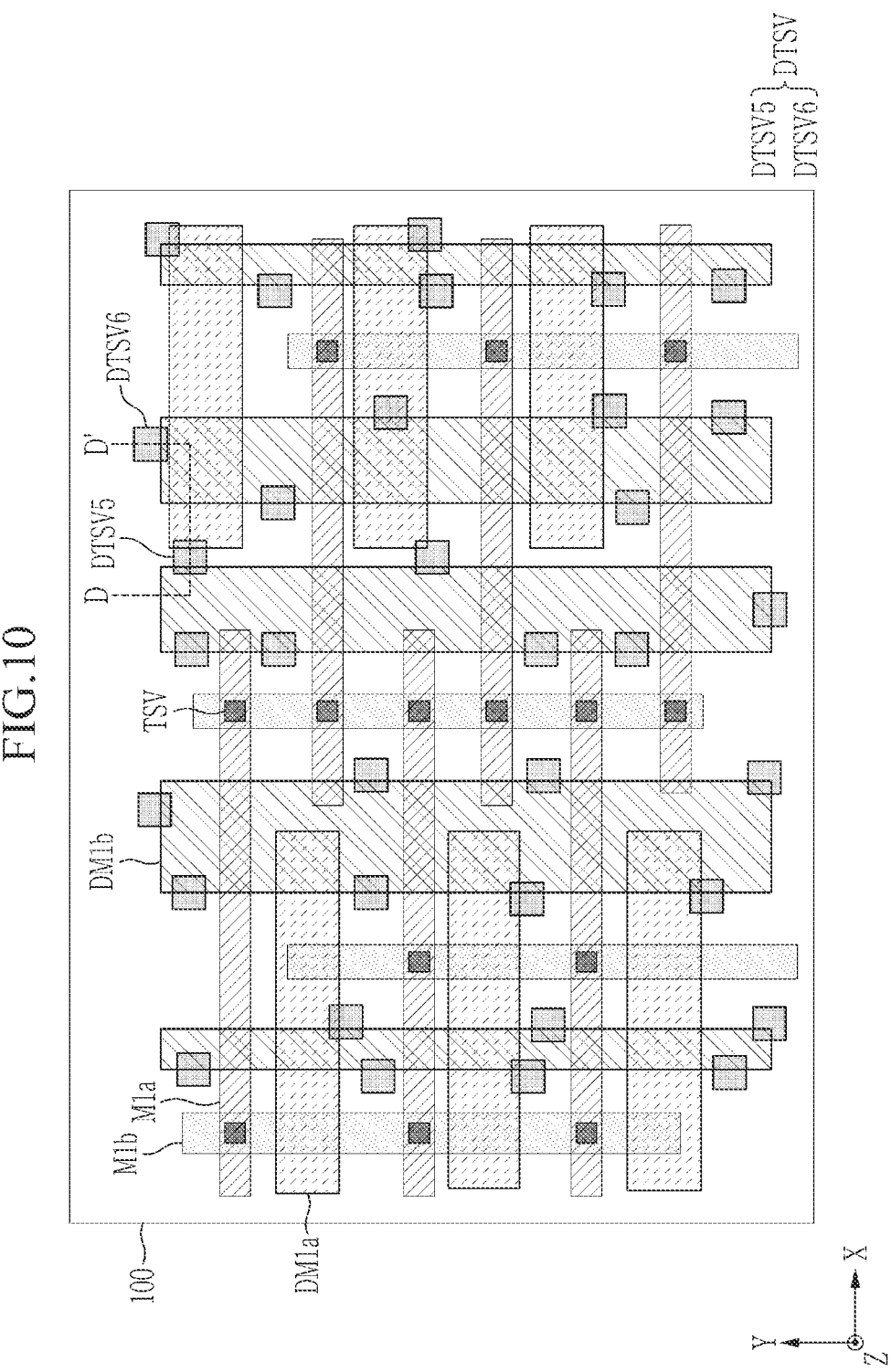
FIG. 10 shows a layout diagram of a semiconductor device according to some embodiments.
Figure 11:
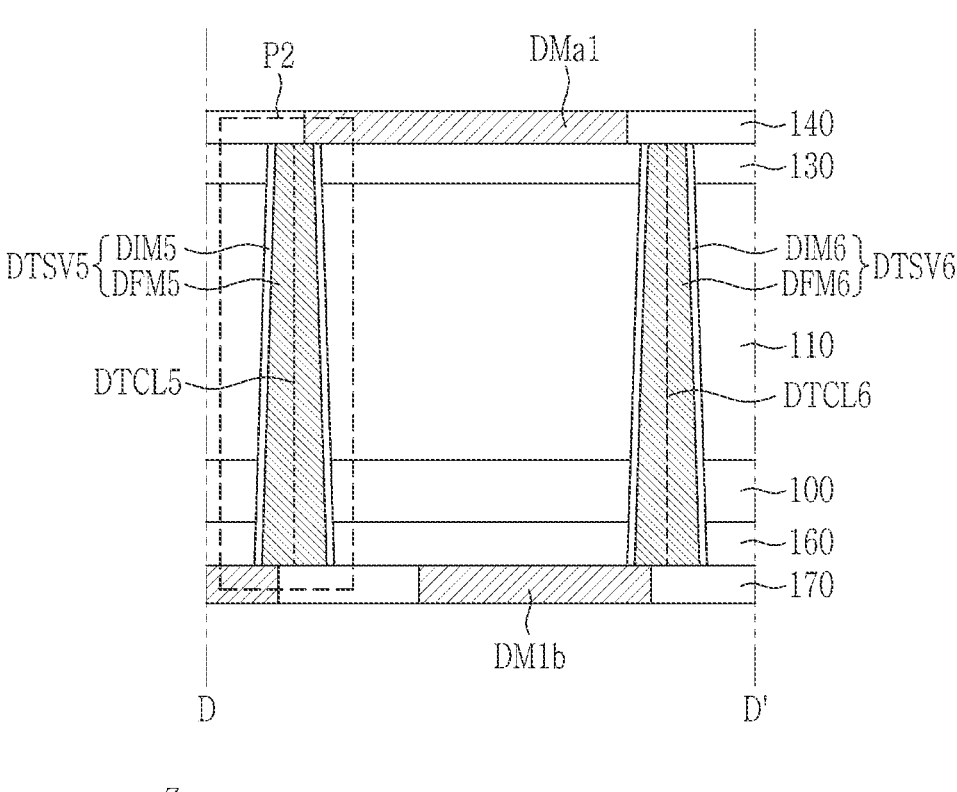
FIG. 11 shows a cross-sectional view with respect to a line D-D' of FIG. 10.
Figure 12:
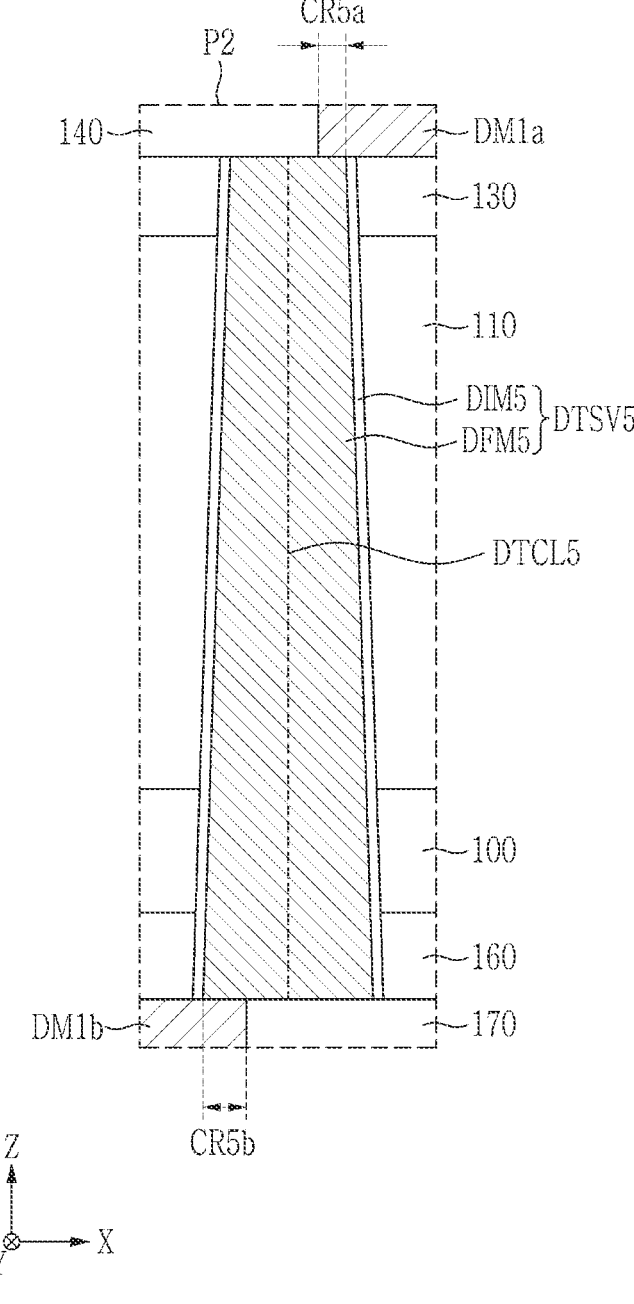
FIG. 12 shows an enlarged view of a region P2 of FIG. 11.

FIG. 10 shows a layout diagram of a semiconductor device according to some embodiments. FIG. 11 shows a cross-sectional view with respect to a line D-D' of FIG. 10. FIG. 12 shows an enlarged view of a region P2 of FIG. 11.

According to an embodiment given with FIG. 10, the dummy through vias DTSV may pass through the substrate 100, may overlap at least one of the first front dummy wire DM1$a$ and the first rear dummy wire DM1$b$, and may be disposed in the cell region of the substrate 100. The dummy through vias DTSV may include fifth dummy through vias DTSV5 and sixth dummy through vias DTSV6 disposed in other regions of the cell region. The cell region shown in FIG. 10 may correspond to the cell region that is different from the cell region shown in FIG. 1.

Referring to FIG. 11 and FIG. 12, the fifth dummy through via DTSV5 may extend to the lower side of the first front dummy wire DM1$a$ from the upper side of the first rear dummy wire DM1$b$, and the sixth dummy through via DTSV6 may extend to the upper side of the third interlayer insulating layer 130 from the upper side of the first rear dummy wire DM1$b$. The fifth dummy through via DTSV5 and the sixth dummy through via DTSV6 may pass through the sixth interlayer insulating layer 160, the substrate 100, the first interlayer insulating layer 110, and the third interlayer insulating layer 130.

In detail, part of the upper side of the fifth dummy through via DTSV5 may contact the lower side of the first front dummy wire DM1$a$, and part of the lower side thereof may contact the upper side of the first rear dummy wire DM1$b$. The center axis DTCL5 of the fifth dummy through via DTSV5 may not overlap the first front dummy wire DM1$a$ and the first rear dummy wire DM1$b$. However, without being limited thereto, in some embodiments, the center axis DTCL5 of the fifth dummy through via DTSV5 may overlap the first front dummy wire DM1$a$ and the first rear dummy wire DM1$b$, part of the upper side of the fifth dummy through via DTSV5 may overlap the first front dummy wire DM1$a$, and part of the lower side thereof may overlap the first rear dummy wire DM1$b$.

The upper side of the sixth dummy through via DTSV6 may not overlap the first front dummy wire DM1$a$, and the lower side thereof may contact the first rear dummy wire DM1$b$. The center axis DTCL6 of the sixth dummy through via DTSV6 may not overlap the first front dummy wire DM1$a$ and the first rear dummy wire DM1$b$ in the third direction (or Z direction). For example, the center axis DTCL6 of the sixth dummy through via DTSV6 may be spaced apart from the first front dummy wire DM1$a$ and the first rear dummy wire DM1$b$ in the first direction (or X direction). However, without being limited thereto, in some embodiments, the center axis DTCL6 of the sixth dummy through via DTSV6 may not overlap the first front dummy wire DM1$a$ and may overlap the first rear dummy wire DM1$b$, and part of the lower side of the sixth dummy through via DTSV6 may contact the first rear dummy wire DM1$b$.

Referring to FIG. 12, the upper side of the fifth dummy through via DTSV5 may include an upper contact portion CR5$a$ contacting the first front dummy wire DM1$a$, the lower side thereof may include a lower contact portion CR5$b$ contacting the first rear dummy wire DM1$b$, and an area of the upper contact portion CR5$a$ may be different from an area of the lower contact portion CR5$b$. For example, the area of the upper contact portion CR5$a$ may be less than the area of the lower contact portion CR5$b$. However, without being limited thereto, in some embodiments, the area of the upper contact portion CR5$a$ may be equal to/greater than the area of the lower contact portion CR5$b$.

Here, the upper side of the fifth dummy through via DTSV5 overlaps the first front dummy wire DM1$a$ at the upper contact portion CR5$a$ in the third direction (or Z direction), and the lower side of the fifth dummy through via DTSV5 overlaps the first rear dummy wire DM1$b$ at the lower contact portion CR5$b$ in the third direction (or Z direction).

The fifth dummy through via DTSV5 and the sixth dummy through via DTSV6 may, in a like way of the above-described first dummy through via DTSV1, include fifth and sixth dummy conductive patterns DFM5 and DFM6 and fifth and sixth dummy insulating patterns DIM5 and DIM6 surrounding the fifth and sixth dummy conductive patterns DFM5 and DFM6.

Further, the fifth and sixth dummy conductive patterns DFM5 and DFM6 may include the same material as the conductive pattern TFM of the above-described through via TSV, and the fifth and sixth dummy insulating patterns DIM5 and DIM6 may include the same material as the insulating pattern IM of the above-described through via TSV. However, the disclosure is not limited thereto.

In some embodiments, the fifth dummy through via DTSV5 and the sixth dummy through via DTSV6 may respectively further include a dummy barrier pattern provided between the fifth and sixth dummy conductive patterns DFM5 and DFM6 and the fifth and sixth dummy insulating patterns DIM5 and DIM6, and the dummy barrier pattern may include the same material as the barrier pattern of the above-described through via TSV.

Figure 13:
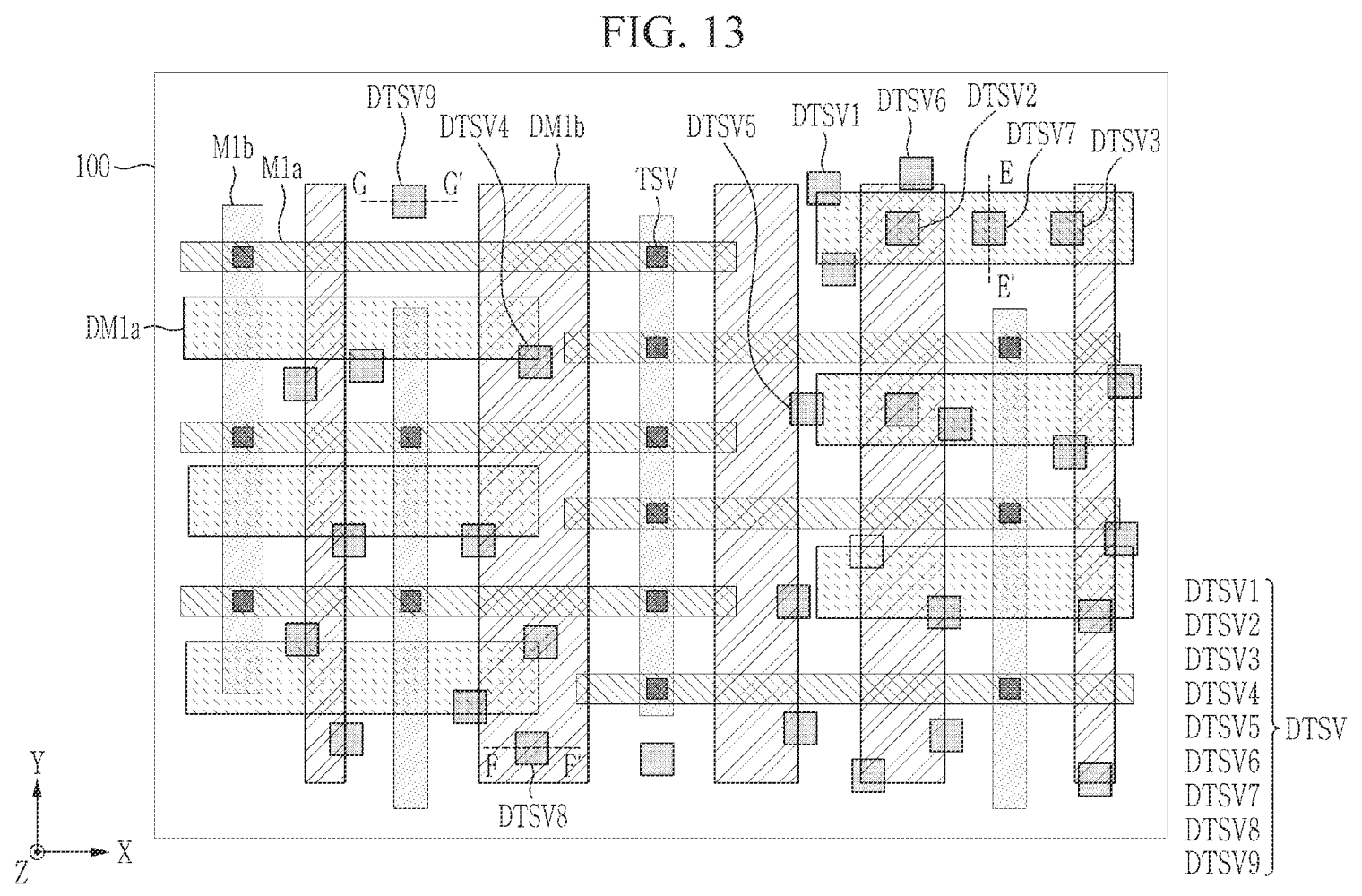
Figure 14:
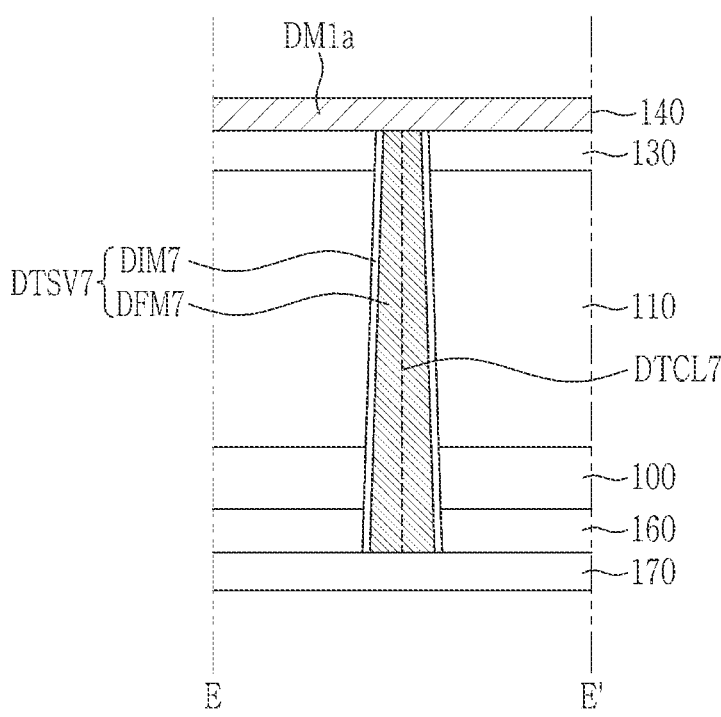
FIG. 14 shows a cross-sectional view with respect to a line E-E' of FIG. 13.
Figure 14:
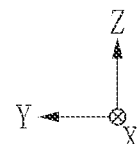
Figure 15:
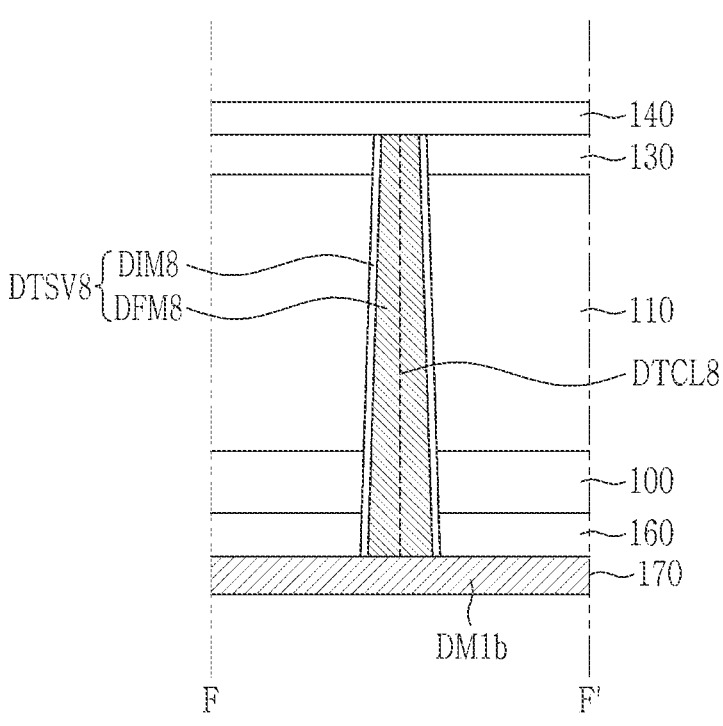
FIG. 15 shows a cross-sectional view with respect to a line F-F' of FIG. 13.
Figure 15:
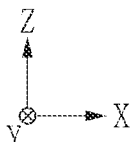
Figure 16:
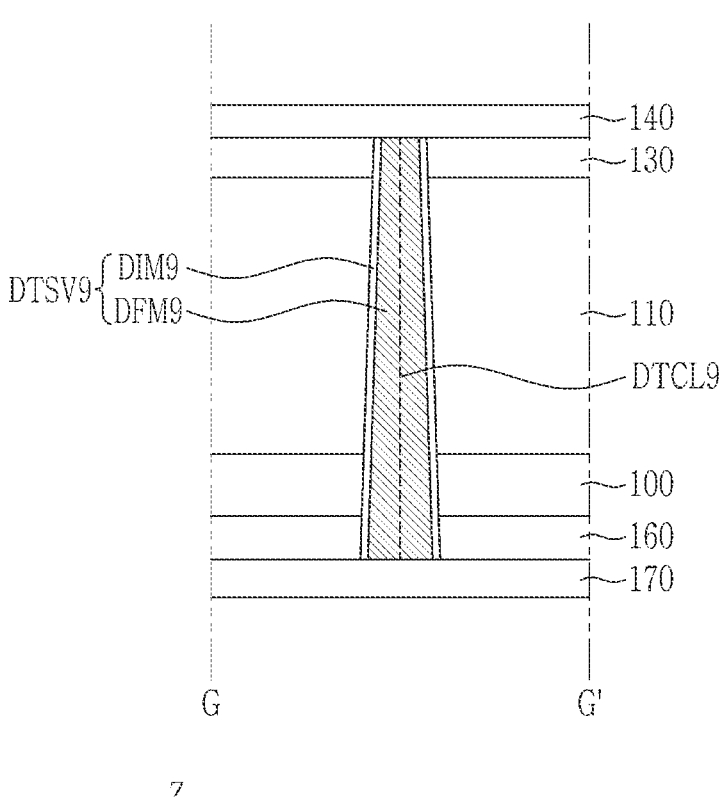
FIG. 16 shows a cross-sectional view with respect to a line G-G' of FIG. 13.

FIG. 13 shows a layout diagram of a semiconductor device according to some embodiments. FIG. 14 shows a cross-sectional view with respect to a line E-E' of FIG. 13. FIG. 15 shows a cross-sectional view with respect to a line F-F' of FIG. 13. FIG. 16 shows a cross-sectional view with respect to a line G-G' of FIG. 13. According to an embodiment described with reference to FIG. 13, the dummy through vias DTSV may include the above-described first to sixth dummy through vias DTSV1, DTSV2, DTSV3, DTSV4, DTSV5, and DTSV6 described with FIG. 1 and FIG. 10.

The dummy through vias DTSV may completely overlap the first front dummy wire DM1$a$, and may further include seventh dummy through vias DTSV7 not overlapping the first rear dummy wire DM1$b$, eighth dummy through vias DTSV8 not overlapping the first front dummy wire DM1$a$ and completely overlapping the first rear dummy wire DM1$b$, and ninth dummy through vias DTSV9 not overlapping the first front dummy wire DM1$a$ and the first rear dummy wire DM1$b$. The cell region shown in FIG. 13 may correspond to a cell region that is different from the cell region on the substrate 100 shown in FIG. 1 and/or FIG. 10.

Referring to FIG. 14, the center axis DTCL7 of the seventh dummy through via DTSV7 may overlap the first front dummy wire DM1*a* and may not overlap the first rear dummy wire DM1*b*. Accordingly, the entire upper side of the seventh dummy through via DTSV7 may contact the lower side of the first front dummy wire DM1*a*, and the lower side thereof may contact the upper side of the seventh interlayer insulating layer 170. The upper side of the seventh dummy through via DTSV7 may completely overlap the first front dummy wire DM1*a*, and the lower side thereof may completely overlap the seventh interlayer insulating layer 170.

Referring to FIG. 15, the center axis DTCL8 of the eighth dummy through via DTSV8 may not overlap the first front dummy wire DM1*a* and may overlap the first rear dummy wire DM1*b*. Hence, the entire upper side of the eighth dummy through via DTSV8 may contact the lower side of the fourth interlayer insulating layer 140, and the lower side thereof may contact the upper side of the first rear dummy wire DM1*b*. The upper side of the eighth dummy through via DTSV8 may completely overlap the fourth interlayer insulating layer 140, and the lower side thereof may completely overlap the first rear dummy wire DM1*b*.

Referring to FIG. 16, the center axis DTCL9 of the ninth dummy through via DTSV9 may not overlap the first front dummy wire DM1*a* and the first rear dummy wire DM1*b*. Accordingly, the entire upper side of the ninth dummy through via DTSV9 may contact the lower side of the fourth interlayer insulating layer 140, and the entire lower side thereof may contact the upper side of the seventh interlayer insulating layer 170. The upper side of the ninth dummy through via DTSV9 may completely overlap the fourth interlayer insulating layer 140, and the lower side thereof may completely overlap the seventh interlayer insulating layer 170.

The seventh to ninth dummy through vias DTSV7, DTSV8, and DTSV9 may, in a like way of the above-described first dummy through via DTSV1, include seventh to ninth dummy conductive patterns DFM7, DFM8, and DFM9 and seventh to ninth dummy insulating patterns DIM7, DIM8, and DIM9 surrounding the seventh to ninth dummy conductive patterns DFM7, DFM8, and DFM9.

Further, the seventh to ninth dummy conductive patterns DFM7, DFM8, and DFM9 may include the same material as the conductive pattern TFM of the above-described through via TSV, and the seventh to ninth dummy conductive patterns DFM7, DFM8, and DFM9 may include the same material as the insulating pattern IM of the above-described through via TSV. However, the disclosure is not limited thereto.

In some embodiments, the respective seventh to ninth dummy through vias DTSV7, DTSV8, and DTSV9 may further include a dummy barrier pattern provided between the seventh to ninth dummy conductive patterns DFM7, DFM8, and DFM9 and the seventh to ninth dummy insulating patterns DIM7, DIM8, and DIM9, and the barrier pattern may include the same material as the dummy barrier pattern of the above-described through via TSV.

In the case of the embodiments given with FIG. 10 to FIG. 16, as the dummy through vias DTSV are formed in the region not overlapping the first front dummy wire DM1*a* and the first rear dummy wire DM1*b* in addition to the region overlapping at least one of the first front dummy wire DM1*a* and the first rear dummy wire DM1*b* in the cell region, the densities of the through via TSV and the dummy through via DTSV may be maintained in the cell regions included in the substrate 100.

For example, to maintain the densities of the through via TSV and the dummy through via DTSV in the cell regions on the substrate 100, a greater number of the dummy through vias DTSV may be formed in the cell region with a relatively greater number of the through vias TSV. A relatively lesser number of the dummy through vias DTSV may be formed in the cell region with a relatively greater number of the through vias TSV.

In some embodiments, as the dummy through vias DTSV are formed in the region overlapping one of the first front dummy wire DM1*a* and the first rear dummy wire DM1*b* and the region not overlapping the first front dummy wire DM1*a* and the first rear dummy wire DM1*b* in addition to the region in which the first front dummy wires DM1*a* traverse the first rear dummy wires DM1*b*, a sufficient number of the dummy through vias DTSV may be obtained in the cell region with a very much lesser number of the through vias TSV.

By this, the patterning process, the etching process, and the chemical mechanical polishing (CMP) process may be fluently performed to thus provide the reliability-increased semiconductor device.

While this disclosure has been described in connection with what is considered to be practical embodiments, it is to be understood that the disclosure is not limited to the disclosed embodiments, but, on the contrary, is intended to cover various modifications and equivalent arrangements included within the spirit and scope of the appended claims.

The invention claimed is:

1. A semiconductor device comprising:
a substrate including a first side and a second side opposite each other with a thickness therebetween;
a first wire disposed on the first side of the substrate;
a first dummy wire disposed on the first side of the substrate and spaced apart from the first wire;
a second wire disposed on the second side of the substrate;
a second dummy wire disposed on the second side of the substrate and spaced apart from the second wire;
a through via passing through the substrate and connecting the first wire and the second wire; and
a plurality of dummy through vias passing through the substrate, wherein the plurality of dummy through vias are laterally offset and physically separated from the first wire and the second wire,
wherein a center of at least one of the plurality of dummy through vias is laterally offset from an edge of at least one of the first dummy wire or the second dummy wire, and
at least one of the plurality of dummy through vias includes a first portion that partially overlaps at least one of the first dummy wire or the second dummy wire, and a second portion that does not overlap the at least one of the first dummy wire or the second dummy wire.

2. The semiconductor device of claim 1, wherein
the plurality of dummy through vias includes a first dummy through via, and
a center of the first dummy through via overlaps the first dummy wire and is laterally offset from an edge of the second dummy wire.

3. The semiconductor device of claim 2, wherein
the first dummy through via overlaps the first dummy wire and is laterally offset from an edge of the second dummy wire.

4. The semiconductor device of claim 2, wherein the first dummy through via completely overlaps the first dummy wire and partly overlaps the second dummy wire.

5. The semiconductor device of claim 1, wherein the plurality of dummy through vias include a second dummy through via, and a center of the second dummy through via is laterally offset from an edge of the first dummy wire and overlaps the second dummy wire.

6. The semiconductor device of claim 5, wherein the second dummy through via is laterally offset from an edge of the first dummy wire and overlaps the second dummy wire.

7. The semiconductor device of claim 5, wherein the second dummy through via partly overlaps the first dummy wire and completely overlaps the second dummy wire.

8. The semiconductor device of claim 1, wherein the plurality of dummy through vias include a third dummy through via, and a center of the third dummy through via is laterally offset from an edge of the first dummy wire and the second dummy wire.

9. The semiconductor device of claim 8, wherein the third dummy through via partly overlaps the first dummy wire and is laterally offset from an edge of the second dummy wire.

10. The semiconductor device of claim 8, wherein the third dummy through via partly overlaps the first dummy wire and partly overlaps the second dummy wire.

11. The semiconductor device of claim 8, wherein the third dummy through via is laterally offset from an edge of the first dummy wire and partly overlaps the second dummy wire.

12. The semiconductor device of claim 1, wherein the plurality of dummy through vias include a fourth dummy through via, and a center of the fourth dummy through via overlaps the first dummy wire and the second dummy wire.

13. The semiconductor device of claim 1, wherein the plurality of dummy through vias include a fifth dummy through via, and the fifth dummy through via is laterally offset and physically separated from the first dummy wire and the second dummy wire.

14. The semiconductor device of claim 1, wherein the plurality of dummy through vias electrically float.

15. A semiconductor device comprising:
a substrate including a first side and a second side opposite each other with a thickness therebetween;
a first wire disposed on the first side of the substrate;
a first dummy wire disposed on the first side of the substrate and spaced apart from the first wire;
a second wire disposed on the second side of the substrate;
a second dummy wire disposed on the second side of the substrate and spaced apart from the second wire;
a through via passing through the substrate and connecting the first wire and the second wire;
a plurality of dummy through vias passing through the substrate and not overlapping the first wire and the second wire; and
an insulation layer disposed on at least one of the first side or the second side of the substrate, wherein a center of at least one of the plurality of dummy through vias does not overlap at least one of the first dummy wire or the second dummy wire,
at least one of the plurality of dummy through vias includes a first portion that partially overlaps at least one of the first dummy wire or the second dummy wire, and a second portion that does not overlap the at least one of the first dummy wire or the second dummy wire, and
at least one of the plurality of dummy through vias contacts the insulation layer.

16. The semiconductor device of claim 15, wherein the plurality of dummy through vias includes a first dummy through via, a second dummy through via, a third dummy through via, and a fourth dummy through via,
a center of the first dummy through via overlaps the first dummy wire and does not overlap the second dummy wire,
a center of the second dummy through via does not overlap the first dummy wire and overlaps the second dummy wire,
a center of the third dummy through via does not overlap the first dummy wire and the second dummy wire, and
a center of the fourth dummy through via overlaps the first dummy wire and the second dummy wire.

17. The semiconductor device of claim 16, wherein the first dummy through via overlaps part of the first dummy wire and overlaps part of the second dummy wire, and
an area where the first dummy through via overlaps the first dummy wire is different from an area where the first dummy through via overlaps the second dummy wire.

18. The semiconductor device of claim 16, wherein the first dummy through via overlaps part of the first dummy wire,
the fourth dummy through via overlaps part of the first dummy wire, and
an area where the first dummy through via overlaps the first dummy wire is different from an area where the fourth dummy through via overlaps the second dummy wire.

19. A semiconductor device comprising:
a substrate including a first side and a second side opposite each other with a thickness therebetween;
a first wire disposed on the first side of the substrate;
a first dummy wire disposed on the first side of the substrate and spaced apart from the first wire;
a second wire disposed on the second side of the substrate;
a second dummy wire disposed on the second side of the substrate and spaced apart from the second wire;
a plurality of through vias passing through the substrate and connecting the first wire and the second wire; and
a plurality of dummy through vias passing through the substrate and laterally offset and physically separated from the first wire and the second wire,
wherein at least one of the plurality of dummy through vias includes a first portion that partially overlaps at least one of the first dummy wire or the second dummy wire, and a second portion that does not overlap the at least one of the first dummy wire or the second dummy wire,
the substrate includes a plurality of cell regions, and
a sum of a number of the through vias and a number of the dummy through vias is constant in the respective cell regions.

20. The semiconductor device of claim 19, wherein
the dummy through vias include a first dummy through via, a second dummy through via, a third dummy through via, and a fourth dummy through via, a center of the first dummy through via overlaps the first dummy wire and is laterally offset from an edge of the second dummy wire, a center of the second dummy through via is laterally offset from a first edge of the first dummy wire and overlaps the second dummy wire, a center of the third dummy through via is laterally offset from a second edge of the first dummy wire and is laterally offset from an edge of the second dummy wire, and a center of the fourth dummy through via overlaps the first dummy wire and the second dummy wire.

\* \* \* \* \*